United States Patent
Liao et al.

(10) Patent No.: US 12,272,637 B2
(45) Date of Patent: Apr. 8, 2025

(54) INTEGRATED FAN-OUT PACKAGE WITH 3D MAGNETIC CORE INDUCTOR

(71) Applicant: Taiwan Semiconductor Manufacturing Company Limited, Hsinchu (TW)

(72) Inventors: Wen-Shiang Liao, Miaoli (TW); Chih-Hang Tung, Hsinchu (TW); Chen-Hua Yu, Hsinchu (TW); Chewn-Pu Jou, Hsinchu (TW); Feng Wei Kuo, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 482 days.

(21) Appl. No.: 17/174,617

(22) Filed: Feb. 12, 2021

(65) Prior Publication Data

US 2021/0193572 A1 Jun. 24, 2021

Related U.S. Application Data

(62) Division of application No. 15/897,272, filed on Feb. 15, 2018, now Pat. No. 10,923,417.

(Continued)

(51) Int. Cl.
*H01L 23/522* (2006.01)
*H01L 21/683* (2006.01)
(Continued)

(52) U.S. Cl.
CPC ...... *H01L 23/5227* (2013.01); *H01L 21/6835* (2013.01); *H01L 23/3114* (2013.01);
(Continued)

(58) Field of Classification Search
CPC ............ H01L 23/5227; H01L 21/6835; H01L 23/3114; H01L 23/645; H01L 23/66;
(Continued)

(56) References Cited

U.S. PATENT DOCUMENTS 3,881,244 A 5/1975 Kendall
5,070,317 A 12/1991 Bhagat
(Continued)

OTHER PUBLICATIONS

Gardner, Donald, Schrom, Gerhard, Hazucha, Peter, Paillet, Fabrice, Karnik, Tanay, Borkar, Shekhar, Saulters, Jason, Owens, Jordan, Wetzel, Jeff; Integrated On-Chip Inductors with Magnetic Films; International Electron Devices Meeting; San Francisco, CA; Dec. 2006.
(Continued)

*Primary Examiner* — Mary A Wilczewski
(74) *Attorney, Agent, or Firm* — Jones Day

(57) ABSTRACT

Among other things, a method of fabricating an integrated electronic device package is described. First trace portions of an electrically conductive trace are formed on an electrically insulating layer of a package structure, and vias of the conductive trace are formed in a sacrificial layer disposed on the electrically insulating layer. The sacrificial layer is removed, and a die is placed above the electrically insulating layer. Molding material is formed around exposed surfaces of the die and exposed surfaces of the vias, and a magnetic structure is formed within the layer of molding material. Second trace portions of the electrically conductive trace are formed above the molding material and the magnetic structure. The electrically conductive trace and the magnetic structure form an inductor. The electrically conductive trace may have a coil shape surrounding the magnetic structure. The die may be positioned between portions of the inductor.

20 Claims, 29 Drawing Sheets

Related U.S. Application Data

(60) Provisional application No. 62/490,063, filed on Apr. 26, 2017.

(51) Int. Cl.
  H01L 23/00   (2006.01)
  H01L 23/31   (2006.01)
  H01L 23/64   (2006.01)
  H01L 23/66   (2006.01)
  H01L 49/02   (2006.01)

(52) U.S. Cl.
  CPC ........ H01L 23/3128 (2013.01); H01L 23/645 (2013.01); H01L 24/06 (2013.01); H01L 24/24 (2013.01); H01L 28/10 (2013.01); H01L 23/66 (2013.01); H01L 24/19 (2013.01); H01L 24/20 (2013.01); H01L 2221/68345 (2013.01); H01L 2224/02371 (2013.01); H01L 2224/02379 (2013.01); H01L 2224/1412 (2013.01); H01L 2224/18 (2013.01); H01L 2224/24195 (2013.01); H01L 2224/2919 (2013.01); H01L 2224/32225 (2013.01)

(58) Field of Classification Search
  CPC ......... H01L 21/56; H01L 23/31; H01L 25/16; H01L 28/10; H01L 24/06; H01L 24/19; H01L 24/20; H01L 24/24; H01L 2224/02371; H01L 2224/02379; H01L 2224/1412; H01L 2224/18; H01L 2224/24195; H01L 2224/2919; H01L 2224/32225; H01L 2224/04105; H01L 2224/12105; H01L 2224/24137; H01L 2224/73267; H01L 2224/92244; H01L 2924/19105; H01L 2924/1206; H01L 2924/19042
  See application file for complete search history.

(56) References Cited

U.S. PATENT DOCUMENTS

| | | | |
|---|---|---|---|
| 5,387,551 | A | 2/1995 | Mizoguchi et al. |
| 5,861,647 | A | 1/1999 | Zhao et al. |
| 6,116,863 | A | 9/2000 | Ahn et al. |
| 6,214,244 | B1 | 4/2001 | Silverbrook |
| 6,303,971 | B1 | 10/2001 | Rhee |
| 6,459,351 | B1 | 10/2002 | Maki et al. |
| 6,657,298 | B1 | 12/2003 | Glenn |
| 6,756,875 | B2 | 6/2004 | Ahn et al. |
| 6,762,925 | B2 | 7/2004 | Uchida et al. |
| 6,771,463 | B2 | 8/2004 | Kamijima |
| 6,970,323 | B2 | 11/2005 | Kamijima |
| 6,998,952 | B2 | 2/2006 | Zhou et al. |
| 7,145,428 | B2 | 12/2006 | Chiu |
| 7,531,824 | B1 | 5/2009 | Johnson et al. |
| 7,852,186 | B2 | 12/2010 | Fouquet et al. |
| 8,072,042 | B1 | 12/2011 | Kroener |
| 8,217,748 | B2 | 7/2012 | Feng et al. |
| 8,987,050 | B1* | 3/2015 | Hiner ................. H01L 23/50 |
| | | | 438/106 |
| 9,275,950 | B2 | 3/2016 | Kuo et al. |
| 9,343,612 | B2 | 5/2016 | Zou et al. |
| 9,496,213 | B2 | 11/2016 | Kidwell, Jr. et al. |
| 9,711,465 | B2 | 7/2017 | Liao et al. |
| 9,761,553 | B2 | 9/2017 | Jou et al. |
| 9,991,216 | B2 | 6/2018 | Liao et al. |
| 9,997,447 | B1* | 6/2018 | Chen ................... H01L 24/20 |
| 10,504,848 | B1* | 12/2019 | Parto .................. H01L 21/4853 |
| 10,867,740 | B2* | 12/2020 | Kidwell, Jr. ......... H01L 23/645 |
| 10,923,417 | B2* | 2/2021 | Liao .................... H01L 23/645 |
| 2002/0047768 | A1 | 4/2002 | Duffy |
| 2003/0076666 | A1 | 4/2003 | Daeche et al. |
| 2003/0137385 | A1 | 7/2003 | Ahn et al. |
| 2003/0222738 | A1 | 12/2003 | Brown et al. |
| 2004/0124961 | A1 | 7/2004 | Aoyagi |
| 2005/0282347 | A1 | 12/2005 | Davies |
| 2007/0025092 | A1 | 2/2007 | Lee et al. |
| 2007/0180684 | A1 | 8/2007 | Wada et al. |
| 2009/0051025 | A1 | 2/2009 | Yang et al. |
| 2009/0079529 | A1 | 3/2009 | Knott et al. |
| 2009/0160595 | A1 | 6/2009 | Feng et al. |
| 2009/0166804 | A1 | 7/2009 | Gardner et al. |
| 2009/0180305 | A1 | 7/2009 | Hashino et al. |
| 2011/0291785 | A1 | 12/2011 | Lim et al. |
| 2012/0249282 | A1 | 10/2012 | Sin et al. |
| 2014/0103499 | A1 | 4/2014 | Andry et al. |
| 2014/0104288 | A1 | 4/2014 | Shenoy et al. |
| 2014/0111273 | A1* | 4/2014 | Jou ...................... H01F 41/046 |
| | | | 327/564 |
| 2014/0252646 | A1 | 9/2014 | Hung et al. |
| 2014/0347025 | A1 | 11/2014 | Liao |
| 2014/0356635 | A1 | 12/2014 | Kim |
| 2015/0279545 | A1 | 10/2015 | Fazelpour et al. |
| 2015/0310994 | A1 | 10/2015 | Yosui et al. |
| 2015/0371772 | A1* | 12/2015 | Jou ...................... H01L 25/16 |
| | | | 427/58 |
| 2016/0093434 | A1 | 3/2016 | Hamada |
| 2016/0141244 | A1* | 5/2016 | Song .................... H01L 21/56 |
| | | | 257/528 |
| 2016/0218072 | A1 | 7/2016 | Liao et al. |
| 2017/0040831 | A1 | 2/2017 | Desai et al. |
| 2017/0311448 | A1* | 10/2017 | Kawabata ........... H01L 23/3121 |
| 2017/0373025 | A1* | 12/2017 | Kim ................... H01L 23/5383 |
| 2018/0138126 | A1* | 5/2018 | Chen .................. H01L 23/50 |
| 2018/0315706 | A1* | 11/2018 | Liao .................. H01L 23/3128 |
| 2018/0316319 | A1* | 11/2018 | Kim ................... H01L 23/12 |
| 2018/0331041 | A1 | 11/2018 | Liao et al. |
| 2019/0035744 | A1* | 1/2019 | Kawabata ............ H01L 23/552 |
| 2019/0089038 | A1 | 3/2019 | Liao |
| 2019/0103680 | A1 | 4/2019 | Liao et al. |
| 2019/0139883 | A1* | 5/2019 | Gandhi ................ H01L 23/50 |
| 2020/0006166 | A1* | 1/2020 | Raorane ................ H01L 23/10 |
| 2020/0098621 | A1* | 3/2020 | Bharath ................ H01L 25/18 |
| 2020/0295121 | A1* | 9/2020 | Liao .................. H01L 23/49838 |
| 2020/0304079 | A1* | 9/2020 | Wakaki ................ H03F 3/195 |
| 2021/0183794 | A1* | 6/2021 | Tang ................... H01L 23/481 |
| 2021/0193572 | A1* | 6/2021 | Liao ................... H01L 24/06 |
| 2022/0320022 | A1* | 10/2022 | Kuo .................. H01L 23/5389 |
| 2023/0118422 | A1* | 4/2023 | Kim ................. H01L 23/49838 |
| | | | 257/773 |
| 2023/0411442 | A1* | 12/2023 | Liao ...................... H01L 23/645 |

OTHER PUBLICATIONS

Gardner, Donald, Schrom, Gerhard, Hazucha, Peter, Paillet, Fabrice, Karnik, Tanay, Borkar, Shekhar; Integrated On-Chip Inductors with Magnetic Films; IEEE Transactions on Magnetics, 43(6); pp. 2615-2617; Jun. 2007.

Standard Practice for Microetching Metals and Alloys; ASTM; Nov. 1999.

Sturken, Noah, O'Sullivan, Eugene, Wang, Naigang, Herget, Philipp, Webb, Bucknell, Romankiw, Lubamyr, Petracca, Michele, Davies, Ryan, Fontana, Robert, Decad, Gary, Kymissis, Ioannis, Peterchev, Angel, Carloni, Luca, Gallagher, William, Shepard, Kenneth; A 2.5D Integrated Voltage Regulator Using Coupled-Magnetic-Core Inductors on Silicon Interposer Delivering 10.8A/mm2; ISSCC, Advances in Heterogeneous Integration, Session 23; pp. 400-402; 2012.

Sturken, Noah, O'Sullivan, Eugene, Wang, Naigang, Herget, Philipp, Webb, Bucknell, Romankiw, Lubamyr, Petracca, Michele, Davies, Ryan, Fontana, Robert, Decad, Gary, Kymissis, Ioannis, Peterchev, Angel, Carloni, Luca, Gallagher, William, Shepard, Kenneth; A 2.5D Integrated Voltage Regulator Using Coupled-Magnetic-Core Inductors on Silicon Interposer, IEEE Journal of Solid-State Circuits, 48(1); op. 244-254; Jan. 2013.

* cited by examiner

INTEGRATED FAN-OUT PACKAGE WITH 3D MAGNETIC CORE INDUCTOR

This application is a divisional application of U.S. patent application Ser. No. 15/897,272, filed Feb. 15, 2018, which claims the benefit of U.S. Provisional Patent Application No. 62/490,063 filed Apr. 26, 2017 entitled "Integrated Fan-Out Package with 3D Magnetic Core Inductor for Wireless Communication," the entire contents of which are incorporated herein by reference.

BACKGROUND

Inductors can be used for various applications, such as filters in circuits, energy storage components, reactors to depress voltage, switching current limiters, transformers, etc. In an example, a transformer can be formed from a first inductor and a second inductor. The transformer can transfer electrical energy from a first circuit to a second circuit using magnetic flux generated between the first inductor and the second inductor. The present inventors have observed that conventional approaches for integrating inductors into semiconductor packages can involve complicated processing and can involve materials that have less than optimal compatibility with typical semiconductor processing, both of which can lead to elevated cost for fabricating such packages.

DESCRIPTION OF THE DRAWINGS

Aspects of the disclosure are understood from the following detailed description when read with the accompanying drawings. It will be appreciated that the dimensions and materials described are exemplary and non-limiting. It will be further appreciated that elements, structures, etc. of the drawings are not necessarily drawn to scale and that the drawings do not necessarily reflect relative dimensions of such features, for example. It will also be appreciated that the terms "on" and "over" and "above" as may be used herein do not necessarily require direct contact of structures described with reference thereto. Moreover, it will be appreciated the terms "over" and "above" do not necessarily require direct vertical alignment or shadowing of one structure relative to another, and may encompass a positional relationship whereby one structure is at a higher or lower level relative to one another and shifted laterally to the other. Direct contact of layers and structures may be illustrated herein according to non-limiting examples, but intervening structures and/or layers are permitted in accordance with the disclosure.

FIG. 3O illustrates a plan (top) view of the structure of FIG. 3M, according to some embodiments.

DETAILED DESCRIPTION

Figure 1A:
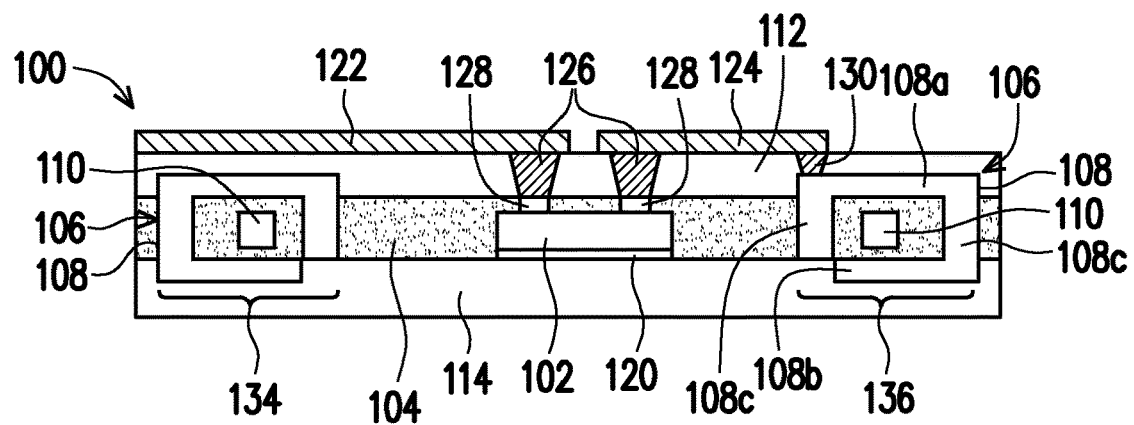
FIGS. 1A and 1B illustrate portions of an integrated electronic device package, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may likewise be interpreted accordingly. Further, the words "about" or "approximately" as used herein should be understood to mean±10% when used in the context of sizes and dimensions and should be understood to mean±2% when used in the context of compositions.

FIG. 1A is a sectional view illustrating a portion of an exemplary integrated electronic device package 100, according to some embodiments. In some embodiments, the integrated electronic device package 100 comprises a semiconductor die 102 that includes an integrated circuit, wherein the semiconductor die 102 is disposed at a first layer 104 of a package structure of the integrated electronic device package 100. The die 102 may be, for example, an application processor die (AP die). The package structure of the of the integrated electronic device package 100 includes multiple layers, and in some embodiments, the first layer 104 includes a molding material (which may also be referred to as a molding compound), which may be any suitable molding material, such as an epoxy molding compound, other silicon based material, or other suitable electrically insulating material.

In some embodiments, the exemplary integrated electronic device package 100 also includes an inductor 106 comprising an electrically conducting trace 108, such as copper or other suitable metal or alloy material, and a magnetic structure 110, the electrically conducting trace 108 being disposed around the magnetic structure 110. The magnetic structure 110 can comprise various materials, such as a ferrite material or other material that supports generation of a magnetic field, as well as other exemplary magnetic materials described herein below. In some embodiments, the electrically conducting trace 108 comprises a trace portion 108a at a second layer 112 of the package structure and a trace portion 108b at a third layer 114 of the package structure. The trace portions 108a and 108b are electrically conducting. In some embodiments, the second layer 112 and third layer 114 may be electrically insulating layers, e.g., electrically insulating polymer materials such as polybenzoxazole (PBO), polyimide (PI), polyimide (PI), benzocyclobutene (BCB), or other polymer material, glass, a spin-on glass (SOG), a ceramic, low temperature co-fired ceramic (LTCC), silicon oxide, silicon nitride, silicon carbide, silicon oxynitride, or the like. In the example of FIG. 1A, the trace 108 also comprises first vias 108c that are electrically conducting, that extend between the second layer 112 and third layer 114, and that electrically interconnect the trace portions 108a and 108b so as to form a coil structure around the magnetic structure 110. It will be appreciated that such a magnetic structure may also be referred to herein as a magnetic core. As referred to herein, vias are not intended to be limited to any particular type of electrically conducting material or any particular method of fabrication. Electrically conducting pillars, whether solid or hollow, or other electrically interconnecting structures, that provide electrical connection between layers and go through the plane of one or more adjacent layers may be considered vias.

Figure 1B:
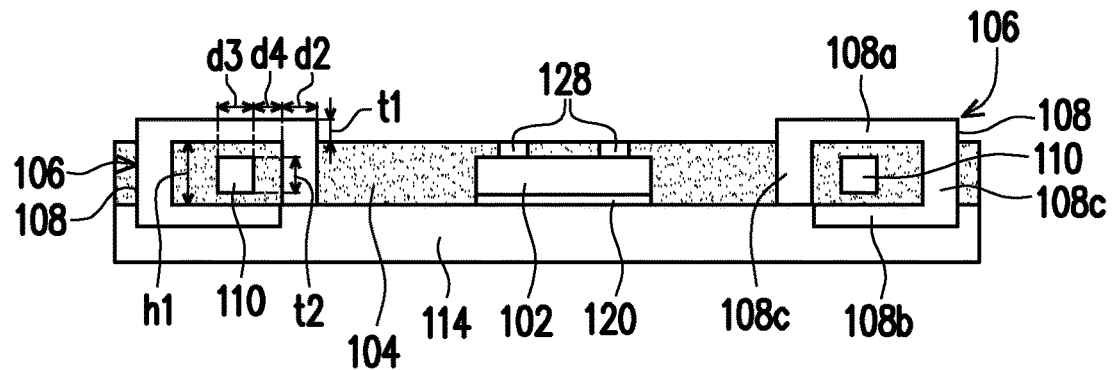

In some embodiments, at least some of the trace portions and/or first vias of the inductor may be embedded in the molding material of the first layer 104 along with the die 102, such as illustrated in the example of FIGS. 1A and 1B wherein first vias 108c are embedded in the molding material of the first layer 104. In the example of FIGS. 1A and 1B, trace portions 108a and 108b are illustrated as being disposed at surfaces of the molding material of layer 104, but one or more of trace portions 108a and 108b may also be embedded in the molding material. In addition, as illustrated in FIG. 1A, in some embodiments, the magnetic structure 110 can be disposed within the coil structure of the inductor 106, e.g., the magnetic structure 110 may be disposed within toroidal shaped windings of the trace 108 to form the inductor 106. As shown in FIG. 1A, a die attach 120 may be disposed between the die 102 and the second layer 114, e.g., to secure the die 102 to layer 114 during fabrication as will be described later herein.

As shown in the example of FIG. 1A, in some embodiments, the exemplary integrated electronic device package 100 may comprise multiple electrically conducting interconnects 122, 124 disposed at one or more layers of the package structure, the multiple electrically conducting interconnects, 122, 124 being electrically connected to the die with second vias 126, which may connect to electrically conducting pads 128 at a surface of the die 102. For example, the electrically conducting interconnects may be disposed at one or more redistribution (RDL) layers. Also, additional interconnects at additional RDL layers may be provided beyond those illustrated in FIG. 1A, which may connect to solder bumps or other connecting structures for interconnection to a printed circuit board (PCB) (not shown) so as to provide communication between the die 102 and the inductor 106 and/or other devices located elsewhere on the PCB. In some embodiments, the multiple electrically conducting interconnects 122, 124 may provide signal routing for the die 102.

In some embodiments, the die 102 may be electrically connected to the inductor 106, e.g., such as shown in FIG. 1A by means of the contact pads 128, via 126, interconnect 124, and via 130.

As shown in the example of FIG. 1A, in some embodiments, the die 102 may be disposed between portions of the inductor 106, e.g., in cross section, the die 102 may be disposed laterally in a plane of the molding material between a first portion 134 of the inductor 106 and a second portion 136 of the inductor 106, e.g., at opposite side portions of the inductor (e.g., parallel to planes of the package structure, such as the RDL layers).

Figure 1C:
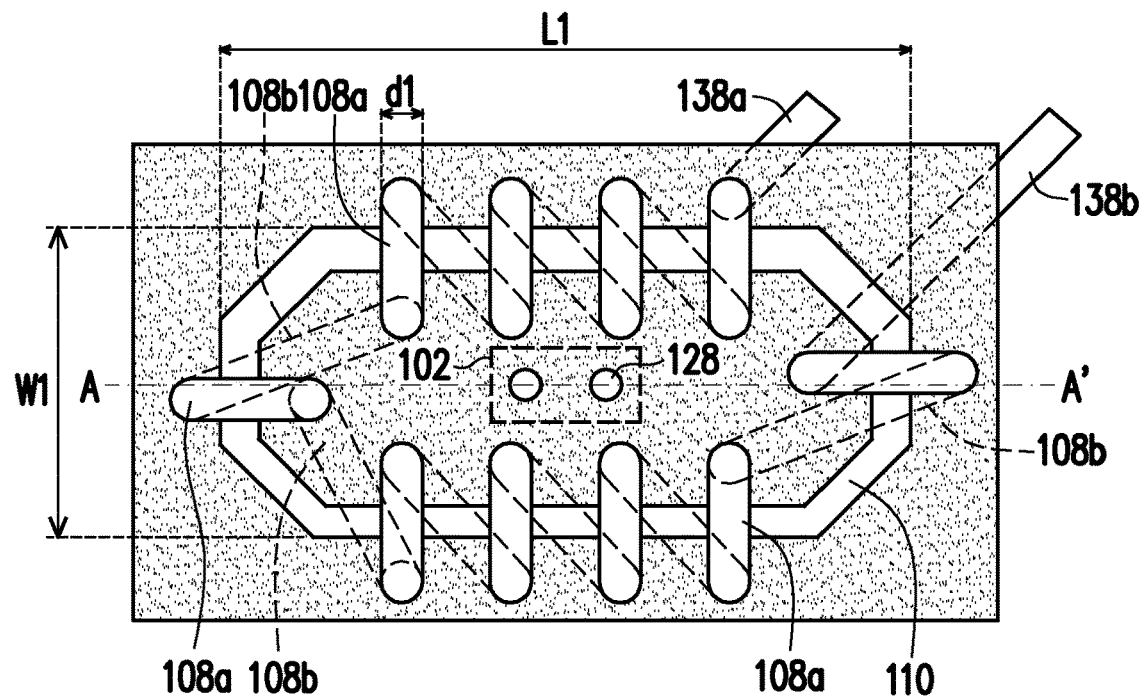
FIG. 1C illustrates a top view of the portion of the integrated electronic device package shown in FIG. 1B.

FIG. 1B illustrates a sectional view of a portion of the integrated electronic device package 100 shown in FIG. 1A, but with some layer portions eliminated from the drawing for ease of description. FIG. 1C illustrates a top view of the portion of the integrated electronic device package 100 shown in FIG. 1B, wherein the sectional view of FIG. 1B is taken along the dotted line A-A' shown in FIG. 1C. As more easily seen in the example of FIG. 1C, in some embodiments, the trace 108 of the inductor 106 may be configured in a toroidal shape, and the die 102 may be disposed at an inner region of the integrated electronic device package 100 surrounded by the toroidal shape. Also, as more easily seen in the example of FIG. 1C, in some embodiments, the magnetic structure 110 may have a closed loop shape, and the die 102 being disposed at a region of the integrated electronic device package 100 surrounded by the closed loop shape. According to some embodiments, the conductive trace 108 is interrupted at a location of the inductor so as to provide a first end 138a and a second end 138 of the conductive trace 108. According to some embodiments, a current source, a voltage source, an active device, etc. may be applied to at least one of the first end 138a or the second end 138b.

It will be appreciated that the inductor 106 formed with trace 108 can be formed according to a variety of shapes, sizes, or configurations, and are not limited to the examples illustrated herein. For ease of description, and without intending the structures disclosed herein to be limited to any particular orientation, a direction perpendicular to planes of the integrated electronic device package 100 will be referred to herein for convenience as a "perpendicular direction," and a direction parallel to planes of the integrated electronic device package 100 will be referred to herein for convenience as a "lateral direction." As shown in the example of FIG. 1C, in some embodiments, a width, i.e., a lateral diameter d1, of a conductive trace portion 108a, 108b in a lateral direction may be in the range from about 0.1 microns to about 20 microns, e.g., about 10 microns in some embodiments. In some embodiments, as shown in the example of FIG. 1B, a thickness, i.e., a height or layer thickness t1 of a planar portion 108a, 108b of the conductive trace 108 in a perpendicular direction may be in the range from about 0.1 microns to about 20 microns, e.g., about 10 microns in some embodiments. In some embodiments, a diameter d2 of a via 108c in a lateral direction that forms part of the conductive trace 108 (see FIG. 1B) may be in the range of about 0.1 microns to 20 microns, e.g., about 10 microns in some embodiments. In some embodiments, a height h1 of a via 108c in a perpendicular direction (see FIG. 1B) may be in the range of about 0.1 microns to about 300 microns, e.g., about 120 microns in some embodiments. Trace portions 108a and 108b may have any desired cross sectional shape, e.g., rectangular, polygon, etc. First vias may have any desired cross sectional shape, e.g., circular, rectangular, etc.

In some embodiments, a diameter d3 of a portion of the magnetic structure 110 in a lateral direction (corresponding to a width of the trench in which the magnetic structure 110 is formed) may be in the range of about 5 microns to about 50 microns, e.g., about 10 microns in some embodiments. In some embodiments, a thickness (i.e., a height or layer thickness) t2 of the magnetic structure 110 in a perpendicular direction may be in the range of about 5 microns to about 50 microns, e.g., about 10 microns in some embodiments. In some embodiments a lateral distance d4 between a side of the magnetic structure 110 and a side of an adjacent via 108c may be in the range of about 0.1 microns to about 50 microns, e.g., about 10 microns in some embodiments. In some embodiments, an overall length L1 of the magnetic structure 110 end-to-end in a first lateral direction may be in the range of about 0.1 millimeters to about 15 millimeters, about 5 millimeters to about 10 millimeters, or other ranges, e.g. about 10 millimeters in some embodiments. In some embodiments, an overall width W1 of the magnetic structure 110 side-to-side in a second lateral direction (90 degrees relative to the first direction in a lateral plane) may be in the range of about 0.1 millimeters to about 15 millimeters, about 5 millimeters to about 10 millimeters, or other ranges, e.g. about 10 millimeters in some embodiments more. In some embodiments, the magnetic structure 110 may have an overall cross-sectional shape in a lateral plane, of a multi-sided polygon, e.g., 4-sided polygon (rectangular, square), 6-sided polygon (hexagonal), 8-sided polygon (octagonal), etc. For instance, the magnetic structure 110 as illustrated in the example of FIG. 1C has an overall shape of an eight-sided polygon in the plane of molding material layer 104. In some embodiments, the magnetic structure 110 may have an overall circular cross-sectional shape in a lateral plane or an oval cross-sectional shape in a lateral plane. Other shapes may also be used.

In some embodiments, the magnetic material of the magnetic structure 110 may comprise a ferrite material. According to some embodiments, the magnetic material of the magnetic structure 110 may comprise a high permeability magnetic material having a magnetic permeability constant ($\mu_r$) such as about $\mu_r > 1000$ henries per meter. According to some embodiments, a spin-coating combination of about 30% to about 50% nickel, about 30% to about 50% zinc, about 10% to about 30% copper, and about 5% to about 25% $Fe_2O_4$ in atomic percent may be used to form the magnetic material of the magnetic structure 110. According to some embodiments, a spin-coating combination of about 70% to about 90% yttrium, about 10% to about 30% bismuth, and about 0.5% to about 1.5% $Fe_5O_{12}$ in atomic percent may be used to form the magnetic material of the magnetic structure 110. According to some embodiments, an electroplating deposition combination of about 70% to about 90% nickel and about 10% to about 30% iron in atomic percent may be used to form the magnetic material of the magnetic structure 110. According to some embodiments, a sputtering combination of about 75% to about 85% nickel and about 15% to about 25% of iron in atomic percent may be used to form the magnetic material of the magnetic structure 110. According to some embodiments, a sputtering combination of about 85% to about 95% cobalt, about 2.5% to about 7.5% tantalum, and about 2.5% to about 7.5% zirconium in atomic percent may be used to form the magnetic material of the magnetic structure 110. In some embodiments, and electroless plating deposition process may be used to form the magnetic material of the magnetic structure 110.

In some embodiments, the magnetic material of the magnetic structure 110 may comprise at least one material selected form the group consisting of $CuFe_2O_4$, $BiFe_5O_{12}$, Ni—Fe alloy, and Co—Ta—Zr alloy. In some embodiments, the magnetic material of the magnetic structure 110 may comprise a mixture of about 40% Ni, about 40% Zn, and about 20% $CuFe_2O_4$ in atomic percent. In some embodiments, the magnetic material of the magnetic structure 110 may comprise a mixture of about 80% Y and about 20% $BiFe_5O_{12}$ in atomic percent. In some embodiments, the magnetic material of the magnetic structure 110 may comprise an alloy of about 80% Ni and about 20% Fe in atomic percent. In some embodiments, the magnetic material of the magnetic structure 110 may comprise an alloy of about 91.5% Co, about 4.5% Ta, and about 4% Zr in atomic percent. Of course, these materials and compositions for the magnetic structure 110 are merely exemplary, and other materials and compositions may be used for the magnetic structure 110.

It will be appreciated that an integrated electronic device package 100 such as described above, e.g., with reference to FIGS. 1A-1C, may include a three-dimensional (3D) inductor 106 and a semiconductor die 102. The 3D inductor 16 may include a magnetic structure 110, e.g., in the form of a magnetic core, wherein inductor wiring, e.g., provided by trace 108 in the form of a coil, may surround the magnetic structure 110. The semiconductor die 102 may comprise an integrated circuit and may comprise, for example, a microprocessor that controls operation of a device, such as a mobile phone, tablet, notebook computer, etc. The die 102 may be disposed in any desired location relative to the 3D inductor 106, e.g., the die 102 may be surrounded in the plane of the die 102 by the 3D inductor 106, and may be surrounded by the magnetic structure 110. Electrical connections that carry signals to and from the die 102, e.g., wires or interconnects 122, 124, may extend from the die 102 to other portions of the integrated electronic device package 100 and may extend to or through portions of the 3D inductor 106.

The exemplary integrated electronic device package 100 such as described above may be an integrated fan-out package (InFO) package, in which the wirings or interconnects 122, 124 formed in an RDL layer may be considered fan-out wirings that extend between input/output (I/O) pads on the die 102 and package I/O pins or bumps. As illustrated in FIG. 1A, the die 102 may be surrounded laterally by a molding material at layer 104, e.g., encapsulant, epoxy resin, glass filled polymer, or the like. As shown in FIG. 1A, the RDL can extend laterally beyond the perimeter of the die 102. The RDL (e.g., second layer 112 in FIG. 1A) comprises a patternable dielectric material, in which conductive patterns and conductive vias can be formed. An InFo package with a 3D inductor according to the present disclosure may be referred to as an InFO package with magnetic core inductor. In addition, such an InFO package with magnetic core inductor may be thin and may provide tight distribution line pitches (e.g., 10 µm).

The inductor 106 with magnetic structure (magnetic core) 110 may serve as an inductor of a wireless charger, a transformer, an antenna, a radio frequency (RF) circuit element (e.g., for impedance matching), and the like. In particular, the inductor 106 with magnetic structure 110 may serve as a near-field coil in a portable wireless device, e.g., a wireless phone or tablet, for implementing wireless charging for the portable wireless device. The same near-field coil may be coupled with a wireless charging power amplifier integrated into the same portable wireless device and multiplexed to configure the wireless portable device as a wireless power transmitter for charging other nearby portable devices, such as Internet-of-Things devices that have wireless charging receiver coils built in.

An exemplary method of fabricating an integrated electronic device package including an inductor will now be described. In this regard, FIG. 2 illustrates an exemplary method 200 of fabricating an integrated electronic device package including an inductor, and FIGS. 3A-3Z illustrate sectional views of an exemplary integrated package structure resulting from a sequence of exemplary processing steps according to an exemplary implementation of the exemplary method 200 of FIG. 2, according to some embodiments.

Figure 2:
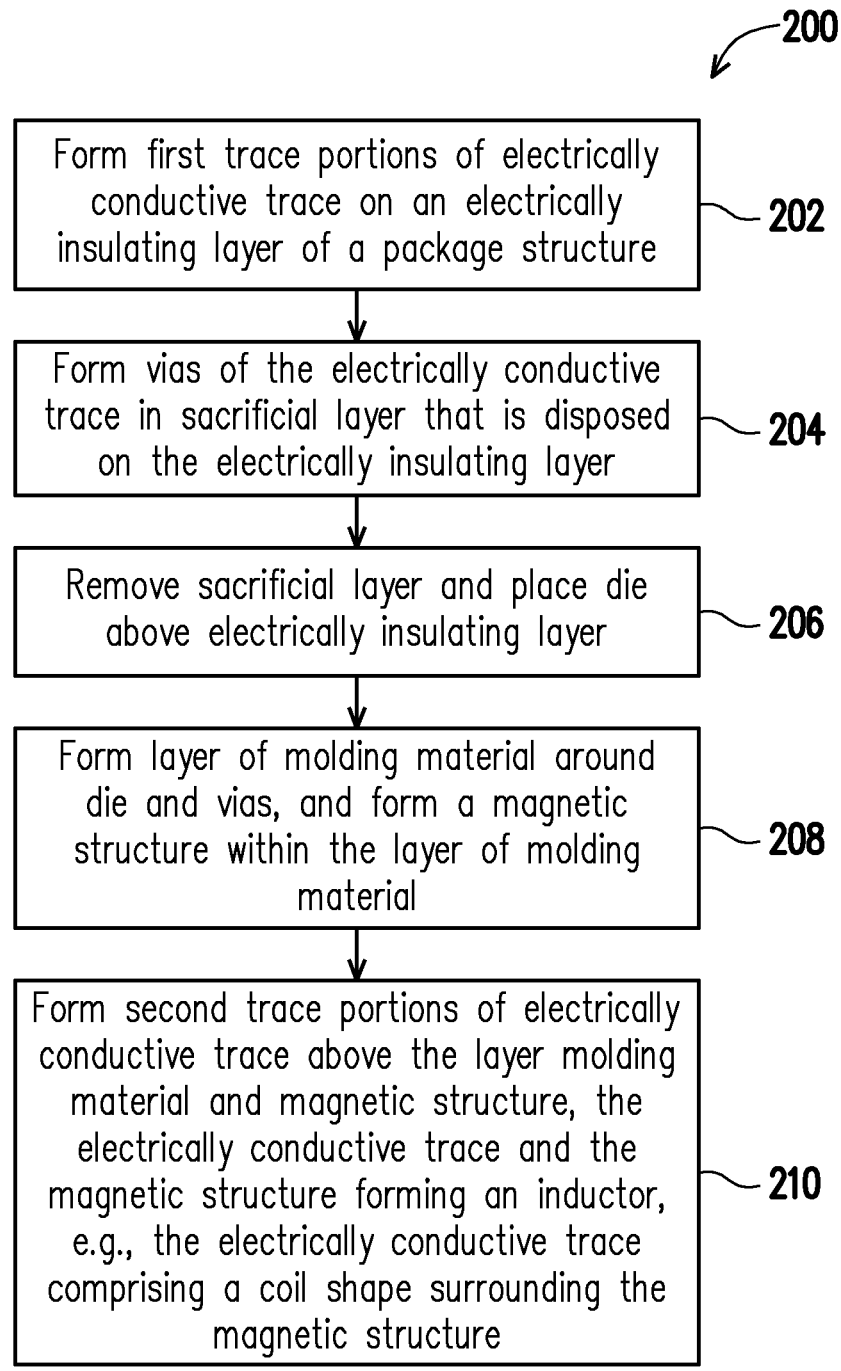
FIG. 2 shows a flow diagram illustrating a method of forming an integrated electronic device package, according to some embodiments.

As shown at step 202 of FIG. 2, the exemplary method 200 comprises forming first trace portions of an electrically conductive trace on an electrically insulating layer of a package structure. An exemplary implementation for this step will be described with regard to FIGS. 3A and 3B. Referring to FIG. 3A, in some embodiments, an electrically insulating layer (dielectric) 306 is formed on a release layer 304, which is disposed on a carrier 302. The electrically insulating layer 306 may be, for example, a layer of polymer material such as, e.g., polybenzoxazole (PBO), polyimide (PI), benzocyclobutene (BCB), or other polymer material that is electrically insulating. In some embodiments, the insulating layer 306 may be referred to as a backside (B/S) insulator-3 layer (e.g., polymer-3) given its placement in the layer structure. In some embodiments, the insulating layer 306 may comprise a glass, a spin-on glass (SOG), a ceramic, low temperature co-fired ceramic (LTCC), silicon oxide, silicon nitride, silicon carbide, silicon oxynitride, or the like. According to some embodiments, the insulating layer 306 may be formed using a spin-on process, a deposition process, an injection process, a growth process, a sputtering process, etc. According to some embodiments, the insulating layer 306 has a thickness that is between about 10 µm to about 1000 µm.

The carrier 302 comprises a temporary material during processing, such as a glass wafer, layer of silicon dioxide, ceramic, polymer, silicon wafer, or the like. In some embodiments, the carrier 302 is a glass carrier that is transmissive to certain wavelengeths, e.g., ultraviolet (UV) radiation. The release layer 304 may comprise a layer of light-to-heat-conversion (LTHC) release coating and a layer of associated adhesive, such materials being known in the art, e.g., as described in U.S. Patent Application Publication No. 20140103499 published Apr. 17, 2014, the entire contents of which are incorporated herein by reference. Briefly, a strongly UV absorbing or UV sensitive material such as trade name material Shin Etsu ODL-38 manufactured by Shin Etsu may be spin applied to the glass carrier 302 at a thickness of about 0.10 µm to about 10 µm and cured in nitrogen atmosphere as the LTCH layer. A layer of suitable adhesive, e.g., one that does not strongly absorb light, may then be spin applied to the LTHC release layer 304 and cured in nitrogen atmosphere, such as, e.g., trade name material TOK TZNR-0136 manufactured by Tokyo Ohka Kogyo Co., Ltd.

Figure 3A:
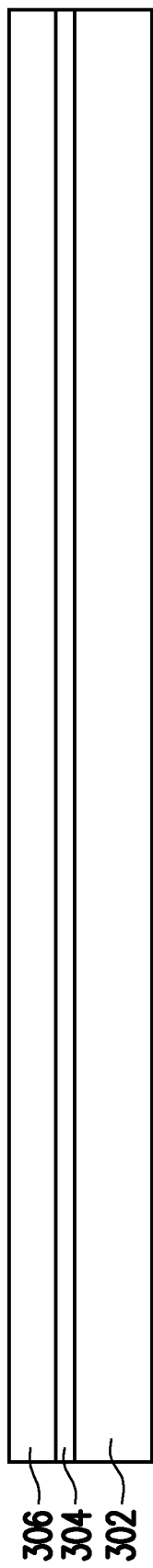
FIG. 3A illustrates forming an electrically insulating layer on the light-to-heat conversion-layer on a glass carrier, according to some embodiments.
Figure 3B:
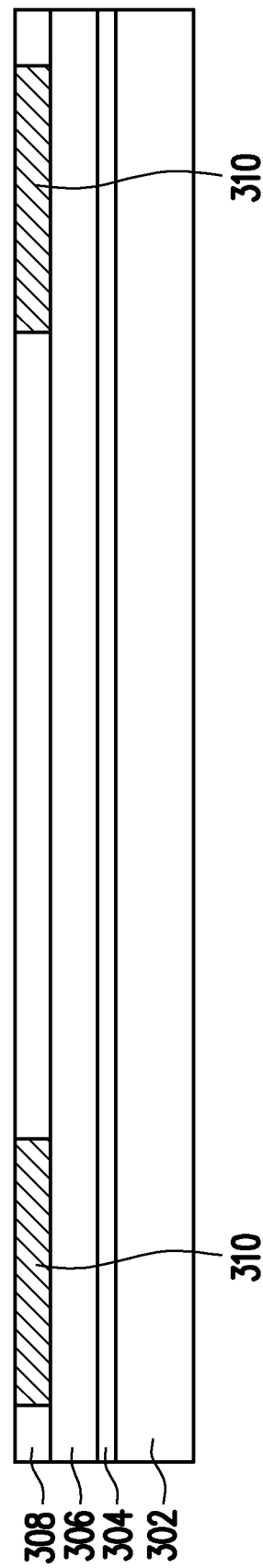
FIG. 3B illustrates forming an additional insulating layer on the structure illustrated in FIG. 3A and patterning the additional insulating area to form first electrically conductive trace portions of a redistribution layer (RDL), according to some embodiments.

Referring to FIG. 3B, another electrically insulating layer 308 is formed on the exposed surface (or major surface) of the structure illustrated in FIG. 3A, e.g., on electrically insulating layer 306 in this example sequence. It will be appreciated that the major surface as referred to in this context is an exposed surface of the structure to be processed during a given step of processing, e.g., an outward facing surface, whose particular material composition and structure may change with successive steps and which evolves with the layer processing of the structure. In some embodiments, the insulating layer 308 may be may be a layer of polymer material such as, e.g., polybenzoxazole (PBO), polyimide (PI), benzocyclobutene (BCB), or other polymer material that is electrically insulating. The insulating layer 308 may be referred to as a backside (B/S) insulator-2 layer (e.g., B/S polymer-2) given its placement in the layer structure. In some embodiments, the insulating layer 308 may comprise a glass, a spin-on glass (SOG), a ceramic, low temperature co-fired ceramic (LTCC), silicon oxide, silicon nitride, silicon carbide, silicon oxynitride, or the like. According to some embodiments, the insulating layer 308 may be formed using a spin-on process, a deposition process, an injection process, a growth process, a sputtering process, etc. According to some embodiments, the insulating layer 308 may have a thickness in the vertical direction that is between about 2 µm to about 50 µm. According to some embodiments, the insulating layer 308 may have a thickness in the vertical direction that is between about 5 µm to about 10 µm, e.g., such as about 7 µm. In some embodiments, the insulating layer 308 may have a thickness of about 10 µm.

As shown in FIG. 3B, in some embodiments, the insulating layer 308 is patterned to form recesses in which metal trace portions 310 of a lower redistribution layer (RDL) are formed, which trace portions 310 will form part of the three-dimensional (3D) integrated inductor described herein. Conventional patterning and metallization techniques (e.g., photolithography, wet etching, dry etching, plasma etching, e.g., reactive ion etching (RIE), planarization with chemical mechanical polishing (CMP), thin-film deposition, electroplating on a deposited seed layer, electroless plating, damascene processing, etc.) may be used to form patterned and metalized structures illustrated herein. In some embodiments, an etch chemistry comprising fluorine, chlorine, hydrogen bromide, boron trichloride, argon, etc., may be used to pattern the insulating layer 308. In some embodiments, metal trace portions 310 may be formed from copper or other metal material using thin-film deposition, such as physical vapor deposition (e.g., sputtering, evaporation such as electron-beam evaporation, etc.), and subsequent patterning. In some embodiments, metal trace portions 310 may be formed from copper or other metal material by depositing a seed layer of copper or other metal into the recesses formed in insulating layer 308, carrying out electroplating of copper or other metal on the seed layer, and then planarizing the outward facing surface (major surface) by chemical mechanical polishing to remove metal from the upper surfaces of the insulating layer and leave metal in the recesses in the insulating layer 308. The metal trace portions 310 may have a thickness in the vertical direction ranging from about 5-10 µm in some embodiments, e.g., about 7 µm thick. In some embodiments, the metal trace portions 310 may have a thickness of about 10 µm.

Accordingly, the foregoing exemplary process steps illustrated in FIGS. 3A and 3B represent an exemplary implementation of a step 202 of FIG. 2 of forming first trace portions (e.g., trace portions 310) of an electrically conductive trace on an electrically insulating layer (e.g., layer 306) of a package structure.

Figure 3C:
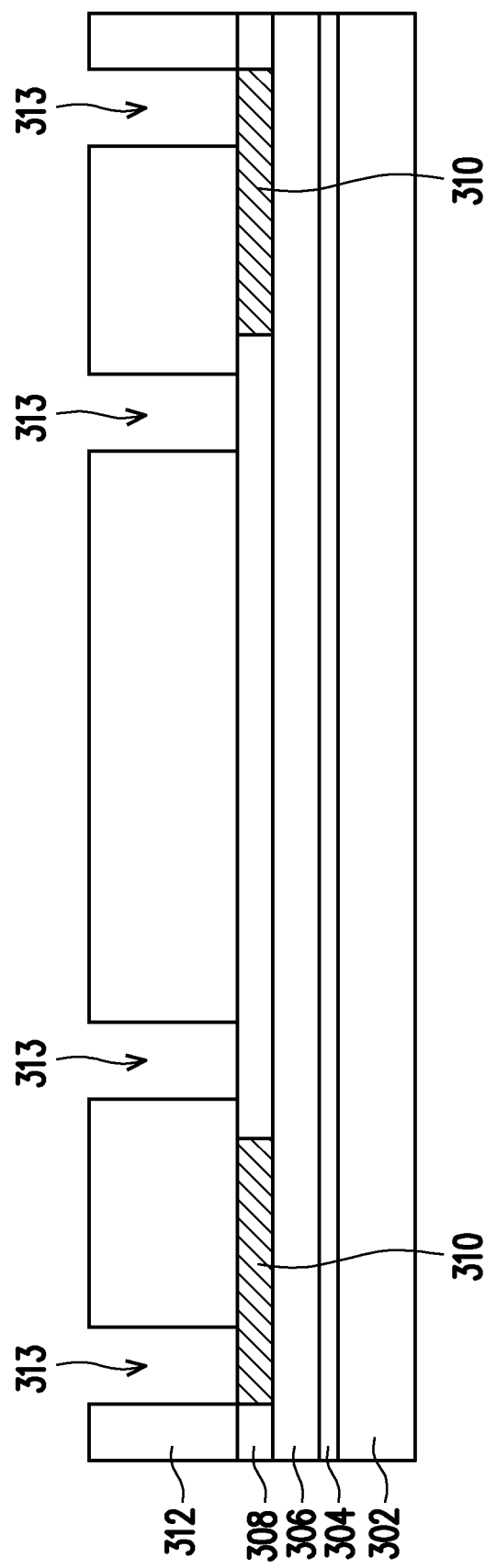
FIG. 3C illustrates forming and patterning a sacrificial layer on the structure of FIG. 3B for forming through-insulator-vias (TIV), according to some embodiments.

The exemplary method 200 of FIG. 2 also comprises at step 204 forming vias of the conductive trace in a sacrificial layer that is disposed on the electrically insulating layer. An exemplary implementation of this step will be described with regard to FIGS. 3C-3F. Turning to FIG. 3C, a sacrificial layer 312 may be formed (e.g., spin coated, deposited, etc.) on the exposed surface (or major surface) of the structure of FIG. 3B, e.g., on insulating layer 308 and metal trace portions 310, and may be patterned to form openings (or through holes) 313 in which to form vias that are electrically conductive (which may also be called, e.g., pillars or through-insulator-vias or TIVs when spanning an insulating layer), according to some embodiments. The sacrificial layer 312 may be a photoresist (PR), e.g., any suitable PR such as a conventional polymer photoresist known in the art, e.g., polymethyl methacrylate (PMMA), which may be spin-coated onto the structure using conventional spin-coating techniques and which may patterned using conventional photolithographic patterning. Laser drilling may also be used, for example, to form opening 313. Other photoresists or other sacrificial layer materials may also be used. In some embodiments, a thickness of the sacrificial layer 312 in a perpendicular direction may be in the range of about 0.1 microns to about 300 microns, e.g., about 120 microns in some embodiments. In some embodiments, a diameter of the openings 313 may be about 0.1 microns to 20 microns, e.g., about 10 microns in some embodiments. In some embodiments, a material other than a photoresist may be used for the sacrificial layer 312, in which case openings 313 may be formed in such layer by forming a layer of photoresist on top of the sacrificial layer 312, patterning the photoresist using conventional photolithography, and then etching the sacrificial layer 312 with the patterned photoresist as an etch mask using any suitable etch chemistry such as those known in the art, e.g., plasma etch chemistry such as described above. The sacrificial layer 312 may be considered sacrificial in the sense that it may be ultimately removed, according to some embodiments, as will be described below.

Figure 3D:
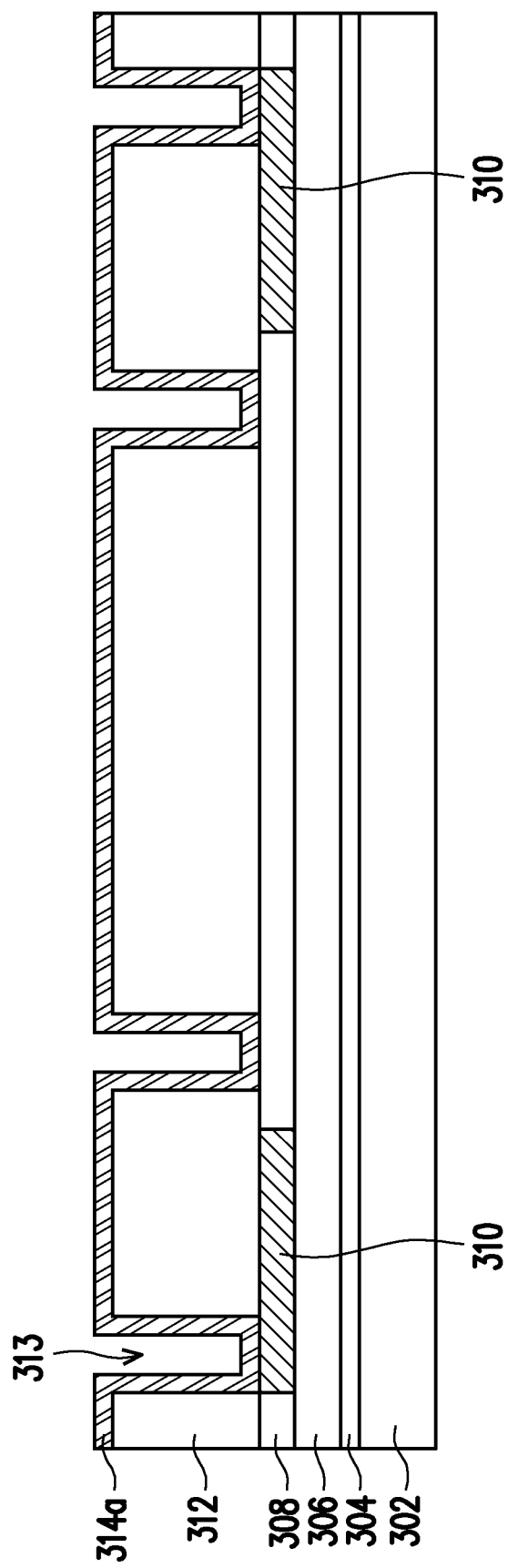
FIG. 3D illustrates forming a metal seeding layer on the patterned sacrificial layer of FIG. 3C, according to some embodiments.

Turning to FIG. 3D, in some embodiments, a metal seeding layer (or seed layer) 314a may be formed on the patterned sacrificial layer 312 of FIG. 3C. The metal seeding layer 314a may be, for example, a Ti/Cu bilayer, a copper layer, or other suitable metal layer, and may be deposited using conventional thin-film deposition such as physical vapor deposition, e.g., sputtering, evaporation such as e-beam evaporation, etc. Any suitable thickness may be used for the metal seeding layer 314a. For example, in some embodiments, 1000 angstroms of titanium and 5000 angstroms of copper may be used as the metal seed layer 314a (e.g., Ti/Cu 1 kA/5 kA). In some embodiments, 500 angstroms of titanium and 3000 angstroms of copper may be used as the metal seeding layer 314a (e.g., Ti/Cu 0.5 kA/3 kA). Other combinations of metal and thicknesses may be used for the seeding layer 314a.

Figure 3E:
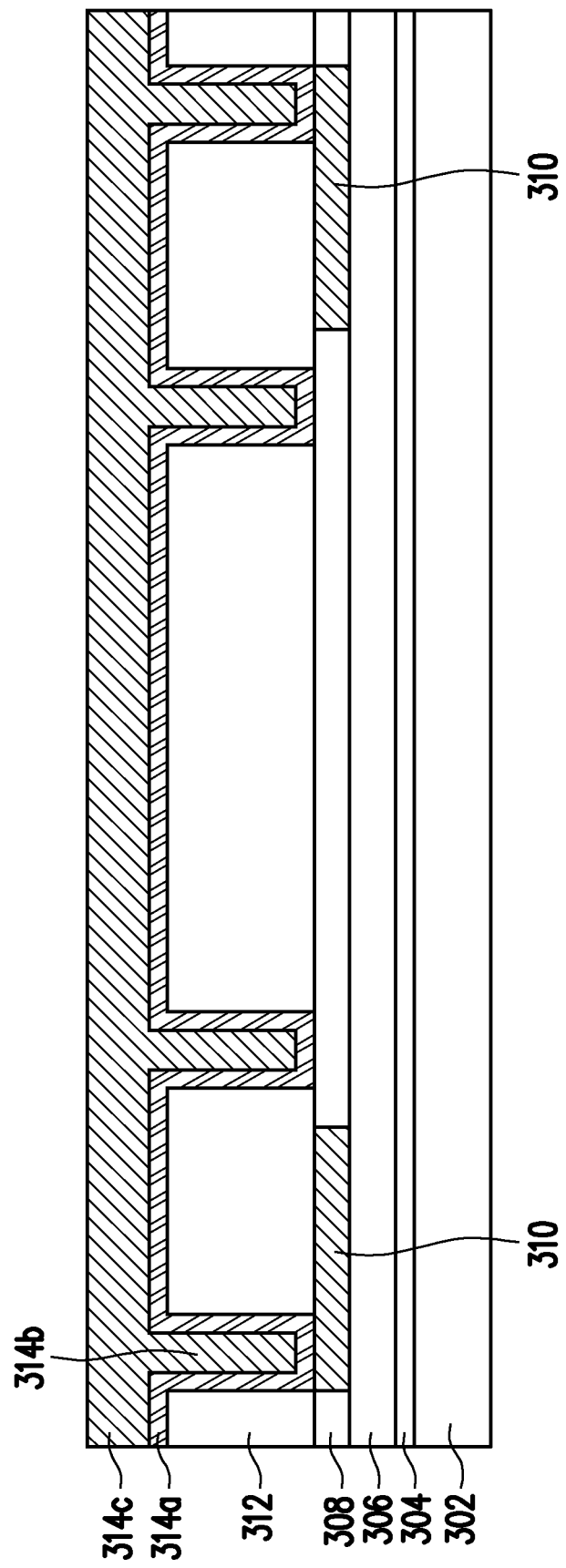
FIG. 3E illustrates forming a metal layer on the metal seeding layer of FIG. 3D, according to some embodiments.

Turning to FIG. 3E, in some embodiments, a metal layer may be formed on the metal seeding layer 314a of FIG. 3D, to yield a metal layer portion 314b inside the openings 313 of the sacrificial layer 312 and a metal layer portion 314c on top of the sacrificial layer 312, according to some embodiments. The metal layer 314b, 314c may be, for example, a copper layer or other suitable metal. In some embodiments, the metal layer 314b, 314c may be formed by electrochemical plating (ECP). The thickness of the metal layer 314b may be thick enough to fill the remaining open portion of openings 313 shown in FIG. 3D, in which electroplated metal will grow both laterally on the walls of the opening 313 as well as vertically at the bottom of the openings 313.

Figure 3F:
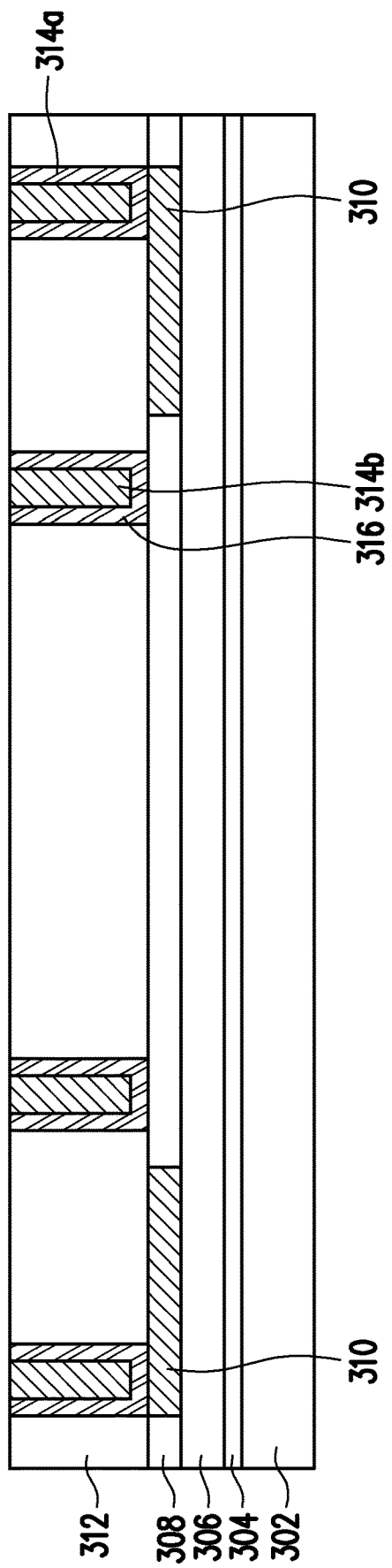
FIG. 3F illustrates planarizing the structure of FIG. 3F, according to some embodiments.

Turning to FIG. 3F, in some embodiments, an outward facing surface (major surface) of the structure of FIG. 3F may be planarized to remove the upper, outward facing metal layer 314c, e.g., by chemical mechanical polishing (CMP), leaving metal 314a and 314b formed inside the openings 313 in the sacrificial layer 312, which thereby form vias 316 within the sacrificial layer 312. In some embodiments, a diameter of openings 316 may be in the range of about 0.1 microns to 20 microns, e.g., about 10 microns in some embodiments. In some embodiments, a height of the vias 316 in a perpendicular direction may be in the range of about 0.1 microns to about 300 microns, e.g., about 120 microns in some embodiments.

Accordingly, the foregoing exemplary process steps illustrated in FIGS. 3C-3F represent an exemplary implementation of a step 204 of FIG. 2 of forming vias that are electrically conductive (e.g., vias 316) of the conductive trace in a sacrificial layer (e.g., layer 312) that is disposed on the electrically insulating layer (e.g., layer 306).

The exemplary method 200 of FIG. 2 also comprises at step 206 removing the sacrificial layer and placing a die above the electrically insulating layer. An exemplary implementation of this step will be described with regard to FIGS. 3G-3I.

Figure 3G:
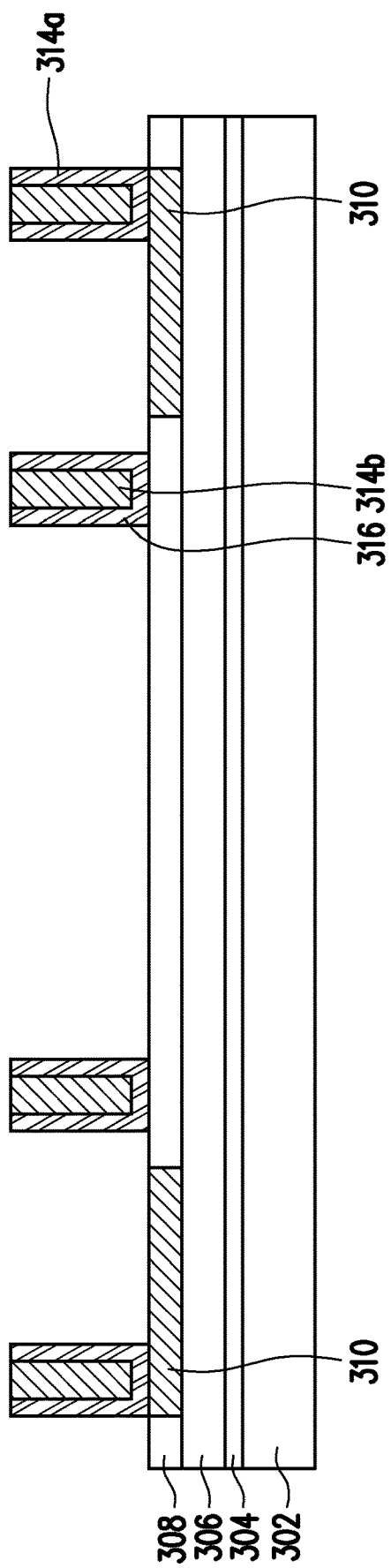
FIG. 3G illustrates removing the sacrificial layer of the structure of FIG. 3F, according to some embodiments.

Turning to FIG. 3G, in some embodiments, the sacrificial layer 312 of the structure of FIG. 3F may be removed, leaving the vias 316 electrically connected to surfaces of respective metal trace portions 310 on which they are formed. As shown in FIG. 3G, the sacrificial layer 312 may be removed, for example, dissolving the sacrificial layer 312 in suitable solvent, etching the sacrificial layer using wet chemistry with an appropriate chemical solution, plasma etching, etc. For example, where the sacrificial layer 312 is a photoresist, it may be removed using conventional reactive ion etching (RIE), conventional stripping solutions tailored for particular photoresists followed optionally by a plasma etch, e.g., in an oxygen plasma, to remove any photoresist residue, such as known in the art. In the view shown in the example of FIG. 3G, the two outer vias 316 are readily observed as being electrically connected to metal trace portions 310. In FIG. 3G, the electrical connections of the inner two vias 316 to respective (other) metal trace portions (not shown) are obscured by a portion of electrically insulating layer 308. A different exemplary view illustrating electrical connections of vias to lower-side metal trace portions are shown in example of FIGS. 1A-1C discussed previously, in which metal vias 108c may be readily observed (e.g., FIG. 1C) to be electrically connected to lower-side metal trace portions 108b (shown in dashed lines in FIG. 1C) as well as upper-side metal trace portions 108a.

Figure 3H:
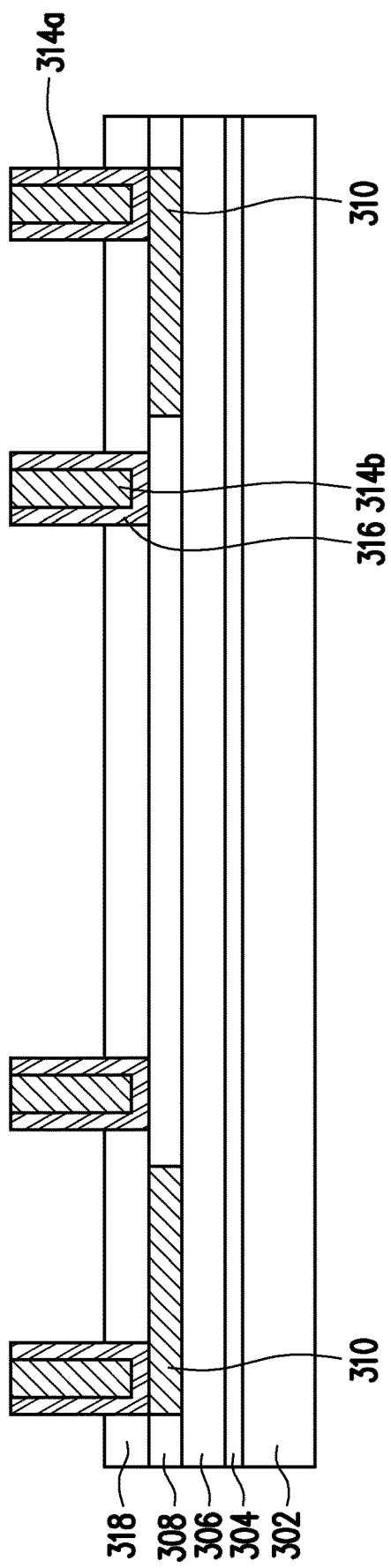
FIG. 3H illustrates forming an electrically insulating layer on the structure of FIG. 3G, according to some embodiments.

Turning to FIG. 3H, in some embodiments, another electrically insulating layer 318 (dielectric) may be formed on the outward facing surface (major surface) of the structure of FIG. 3G, e.g., formed on the electrically insulating layer 308. In some embodiments, the insulating layer 318 may be may be a layer of polymer material such as, e.g., polybenzoxazole (PBO), polyimide (PI), benzocyclobutene (BCB), or other polymer material that is electrically insulating. The insulating layer 318 may be referred to as a backside (B/S) insulator-1 layer (e.g., B/S polymer-1) given its placement in the layer structure. In some embodiments, the insulating layer 318 may comprise a glass, a spin-on glass (SOG), a ceramic, low temperature co-fired ceramic (LTCC), silicon oxide, silicon nitride, silicon carbide, silicon oxynitride, or the like. According to some embodiments, the insulating layer 318 may be formed using a spin-on process, a deposition process, an injection process, a growth process, a sputtering process, etc. In some embodiments, the insulating layer 318 may be PBO or PI formed by a spin-on process. According to some embodiments, the insulating layer 318 may have a thickness in the vertical direction that is between about 2 µm to about 50 µm. According to some embodiments, the insulating layer 318 may have a thickness in the vertical direction that is between about 5 µm to about 10 µm, e.g., such as about 7 µm. In some embodiments, the insulating layer 308 may have a thickness of about 10 µm.

Figure 3I:
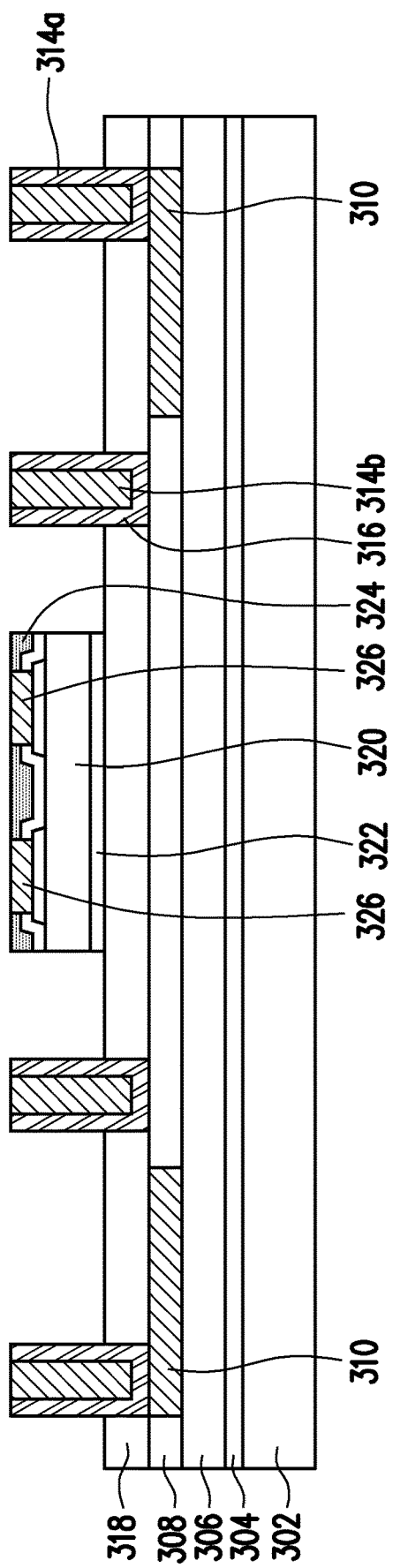
FIG. 3I illustrates placing a die on an exposed surface of the outermost insulating film FIG. 3H, according to some embodiments.

Turning to FIG. 3I, a die 324, such as an application processor die (AP die), can be placed on an exposed surface of the outward facing electrically insulating layer 318 of FIG. 3H, according to some embodiments. As shown in FIG. 3I, the die 324 may be secured to the surface of the insulating layer 318 with a die attach 322, such as a die attach film (DAF). The die 320 may be prepared via wafer level processing with metal bonding pads 326 and passivation 324, e.g., one or more dielectric, insulating layers, so as to permit input and output electrical communication with electrical circuitry of the die 320. The die 320 may be placed in a desired position using precision robotic placement tools as is known in the art. As illustrated in FIG. 3I, the thickness of the die 320 with passivation 324 and pads 326, the thickness of the die attach 322, the thickness of the electrically insulating layer 318, and the height of the vias 316 may be chosen such that upper surfaces of the pads 326 are positioned at about the same height in the layer structure as the upper surfaces of the vias 316.

Accordingly, the foregoing exemplary process steps illustrated in FIGS. 3G-3I represent an exemplary implementation of a step 206 of FIG. 2 of removing the sacrificial layer (e.g., layer 312) and placing a die (e.g., die 320) above the electrically insulating layer (e.g., insulating layer 306).

The exemplary method 200 of FIG. 2 also comprises at step 208 forming a layer of molding material around the die and the vias, and forming a magnetic structure within layer of molding material. An exemplary implementation of this step will be described with regard to FIGS. 3J-3S.

Figure 3J:
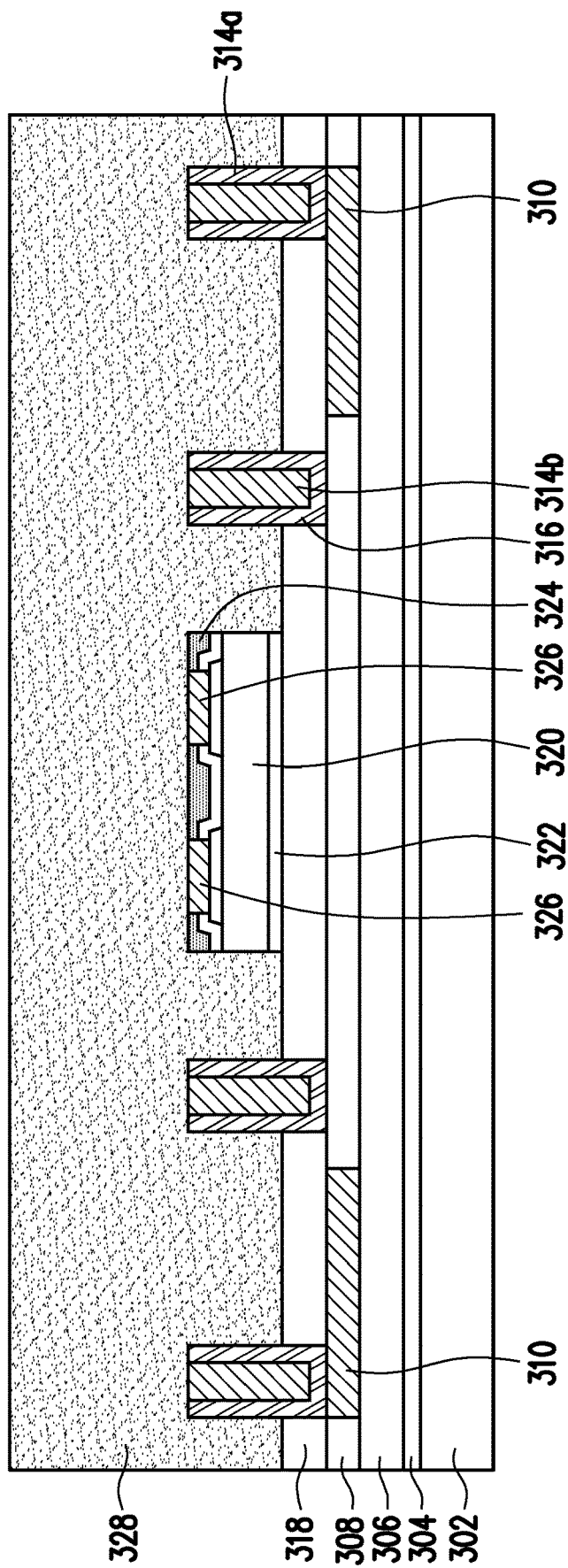
FIG. 3J illustrates forming an electrically insulating molding material or molding compound over the die and TIVs of the structure of FIG. 3I, according to some embodiments.

Turning to FIG. 3J, an electrically insulating molding material (or molding compound) 328 can be formed over and around exposed surfaces of the die 320 and the electrically conducting vias 316 of the structure of FIG. 3I, according to some embodiments, e.g., formed over the outward facing surface (major surface) of the structure of FIG. 3I. The molding material 328 can comprise a dielectric material, such as silicon based material, an epoxy molding compound, or the like, that provides electrical isolation between the vias 316 and other structures formed on the carrier 302. The molding material 328 can be formed according to various formation techniques, such as a spin-on process, a deposition process, or an injection process, for instance. The thickness of the molding material 328 may be provided at any desired thickness, e.g., in the range of about 25 microns in thickness above the upper surface of the die 320 to about 500 microns in thickness above the upper surface of the die 320. In some embodiments, the thickness of the molding material 328 may be about 50 microns in thickness above the upper surface of the die 320.

Figure 3K:
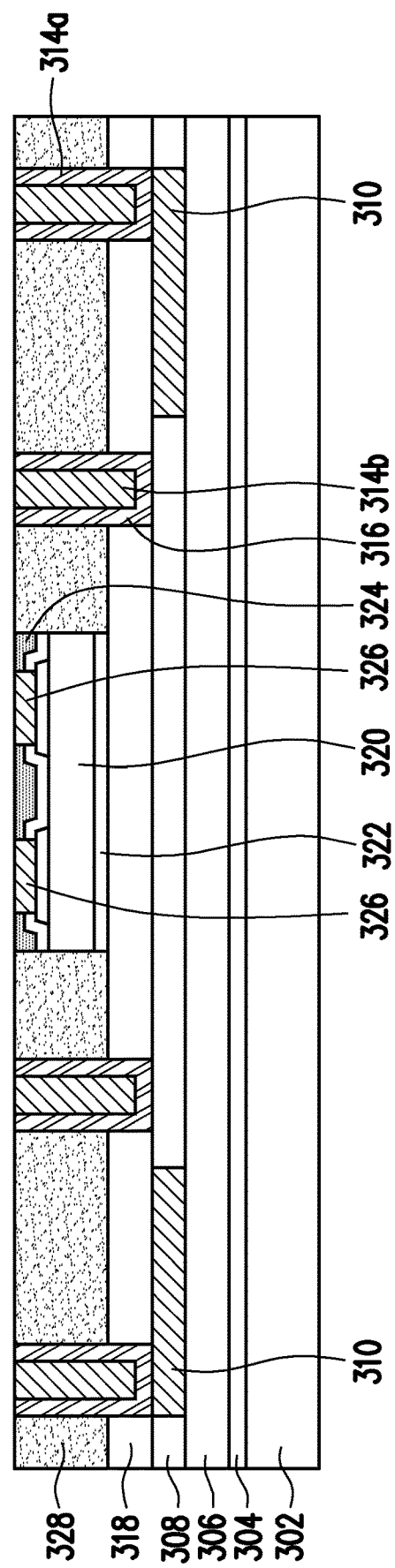
FIG. 3K illustrates planarizing the structure of FIG. 3J, according to some embodiments.

Turning to FIG. 3K, the outward facing surface of the molding material 328 may be planarized by grinding and CMP to remove a portion of the molding material 328 so as to expose upper surfaces of the electrically conducting vias 316 and pads 326 on the die 320 structure of FIG. 3J, according to some embodiments. As illustrated in FIG. 3K, the planarization may result in the upper surfaces of the vias 316 and pads 326 being aligned at the same height in the layer structure.

Figure 3L:
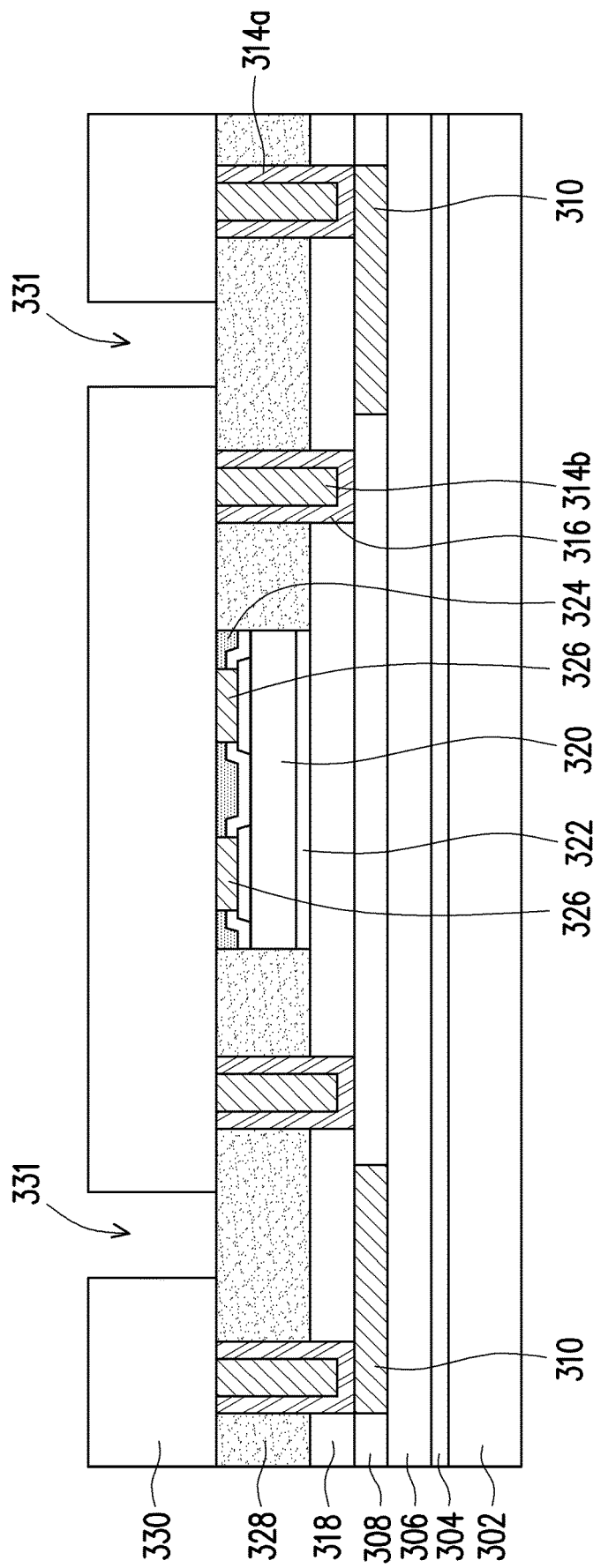
FIG. 3L illustrates forming and patterning a sacrificial layer on the structure of FIG. 3K to for forming a trench in the molding material, according to some embodiments.
Figure 3M:
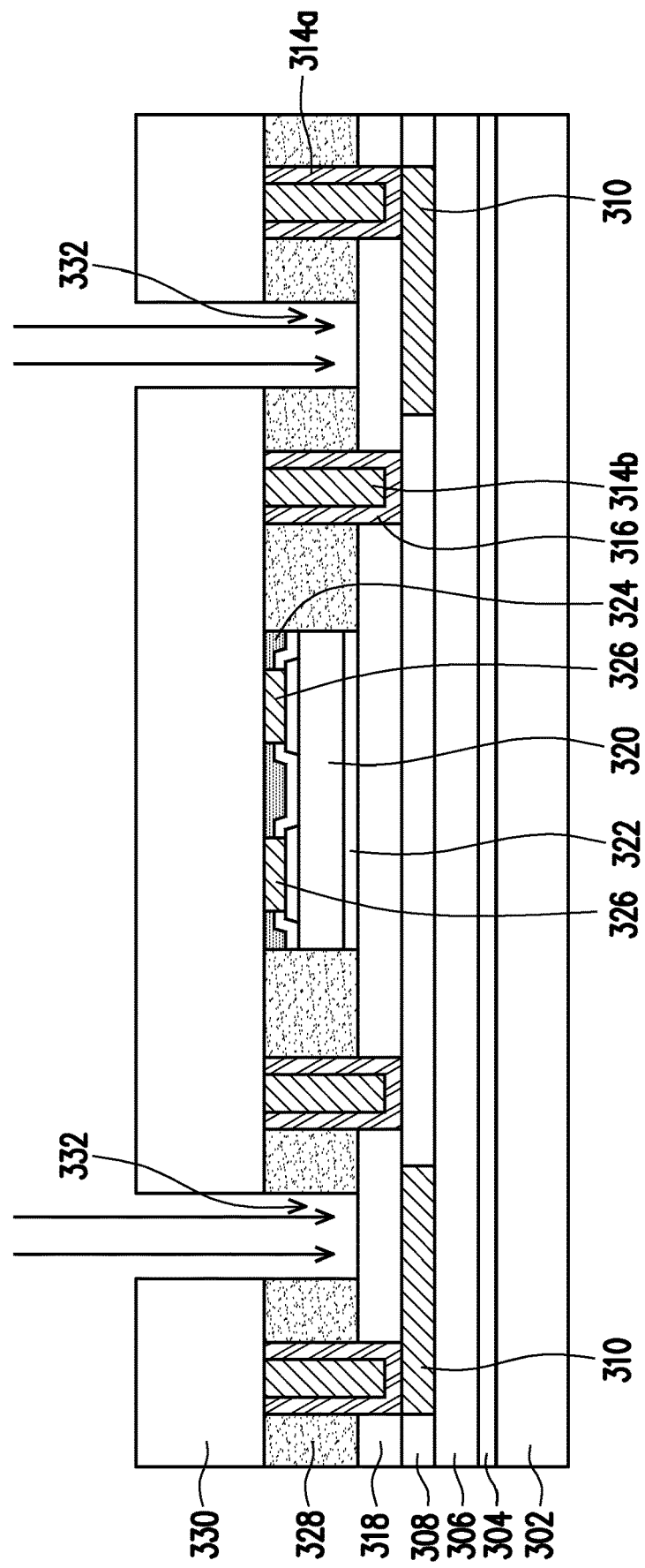
FIG. 3M illustrates forming a trench in the molding material with an etching process using the patterned sacrificial layer of caps FIG. 3L as a mask, according to some embodiments.
Figure 3N:
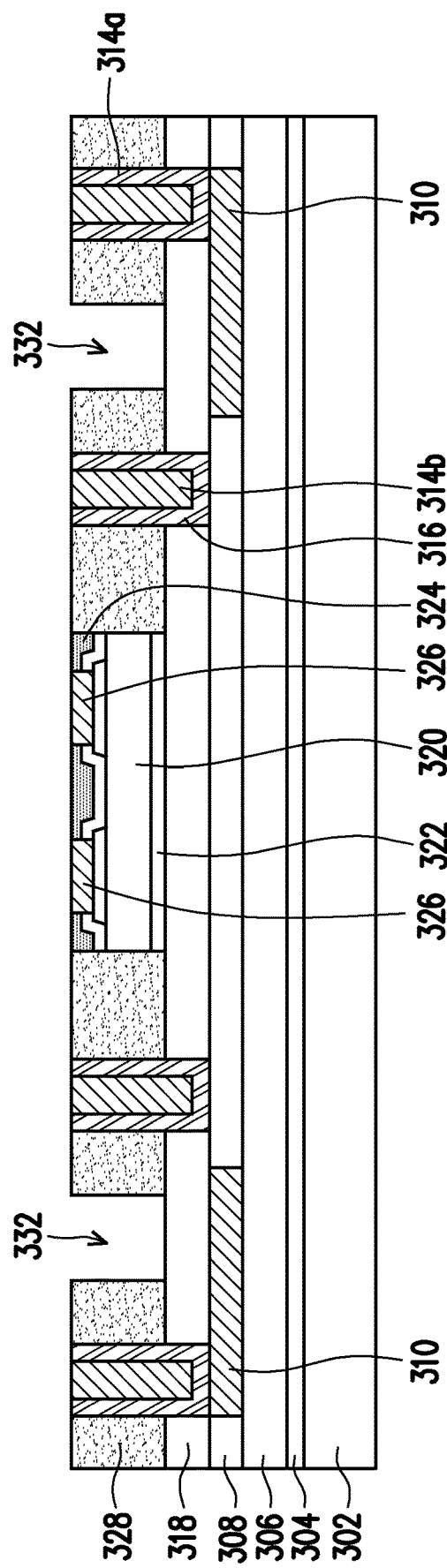
FIG. 3N illustrates removing the sacrificial layer of FIG. 3M, according to some embodiments.
Figure 30:
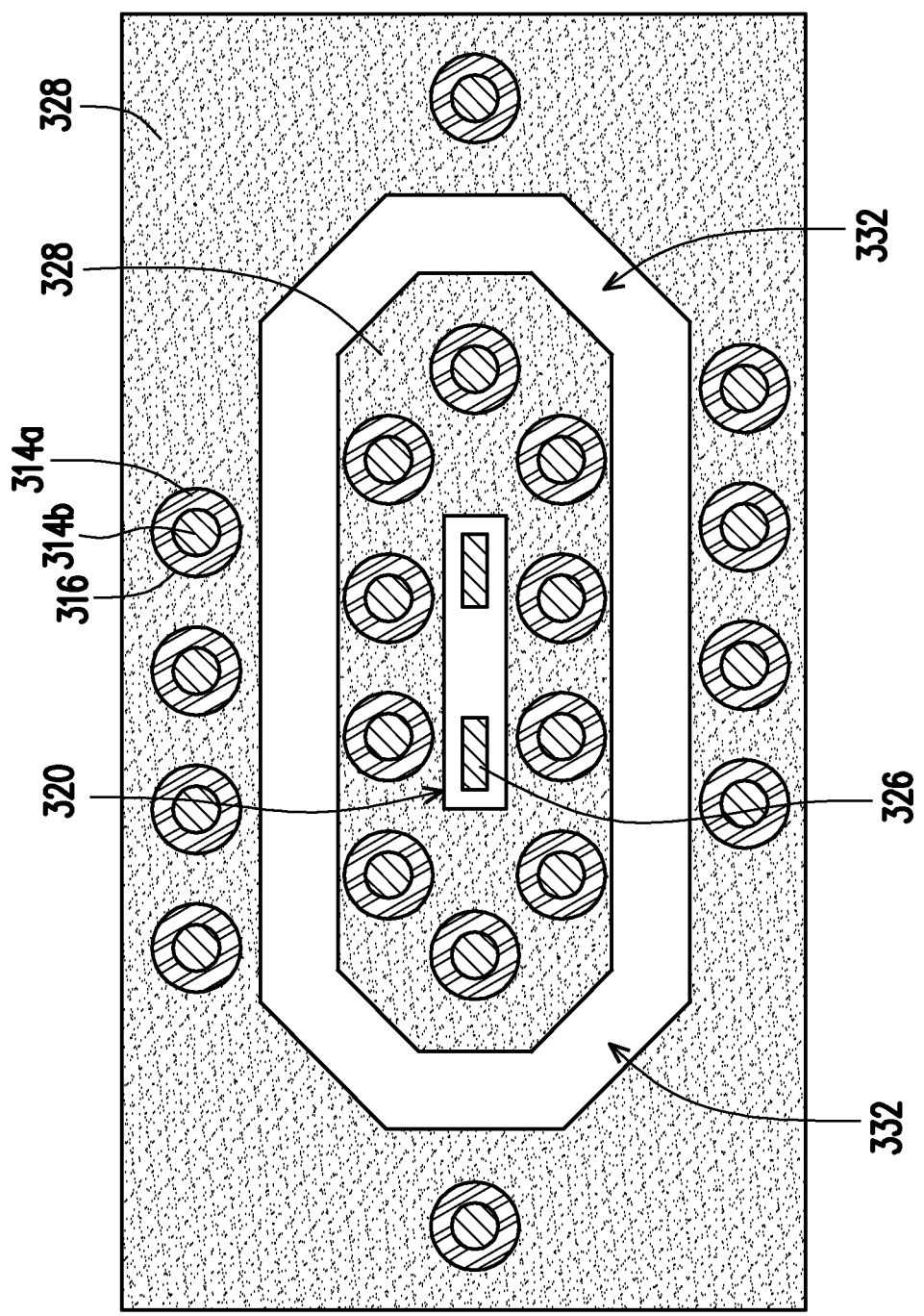

Turning to FIG. 3L, a patterned mask layer 330 can be formed on the outward facing surface (major surface) of the structure of FIG. 3K to serve as an etch mask for patterning the underlying molding material 328. For example, a photoresist material may be deposited, e.g., by spinning, onto the outward facing surface of the structure of FIG. 3K and then patterned by conventional lithography to form an opening(s) 331 therein, thereby forming the patterned mask layer 330 in some embodiments. The opening(s) 331 may be in the form of a closed loop so as to permit the patterned mask layer 330 to serve as an etch mask for etching a trench into the molding material 328, in some embodiments. As shown in FIG. 3M, directional etching such as plasma etching, reactive ion etching (RIE), etc., may be carried out to etch an opening(s) 332 into the molding material 328. The opening(s) 332 may also be formed laser drilling in some embodiments. The opening(s) 332 may be in the form of a closed-loop trench in some embodiments. As shown in FIG. 3N, the patterned mask layer 330 may then be removed, e.g., using conventional reactive ion etching (RIE), conventional stripping solutions tailored for particular photoresists followed optionally by a plasma etch, e.g., in an oxygen plasma, to remove any photoresist residue, such as known in the art.

FIG. 3O illustrates a plan (top) view of the structure of FIG. 3M, according to some embodiments. As shown in FIG. 3O, the opening 332 in the molding material 328 may be in the form of a trench, e.g., a closed-loop trench, that laterally surrounds the die 320 and various ones of the electrically conducting vias 316, with other ones of the electrically conducting vias 316 being disposed laterally outside the trench opening 332.

Figure 3P:
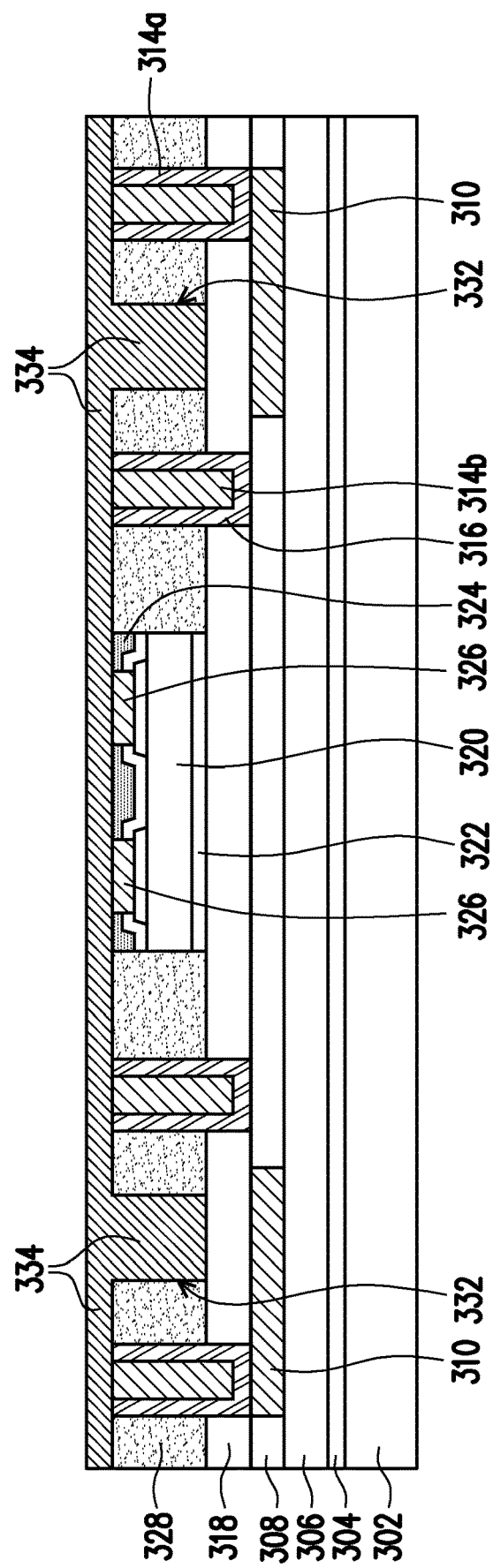
FIG. 3P illustrates forming magnetic material in the trench and exposed surface of the structure of FIG. 3O, according to some embodiments.
Figure 3Q:
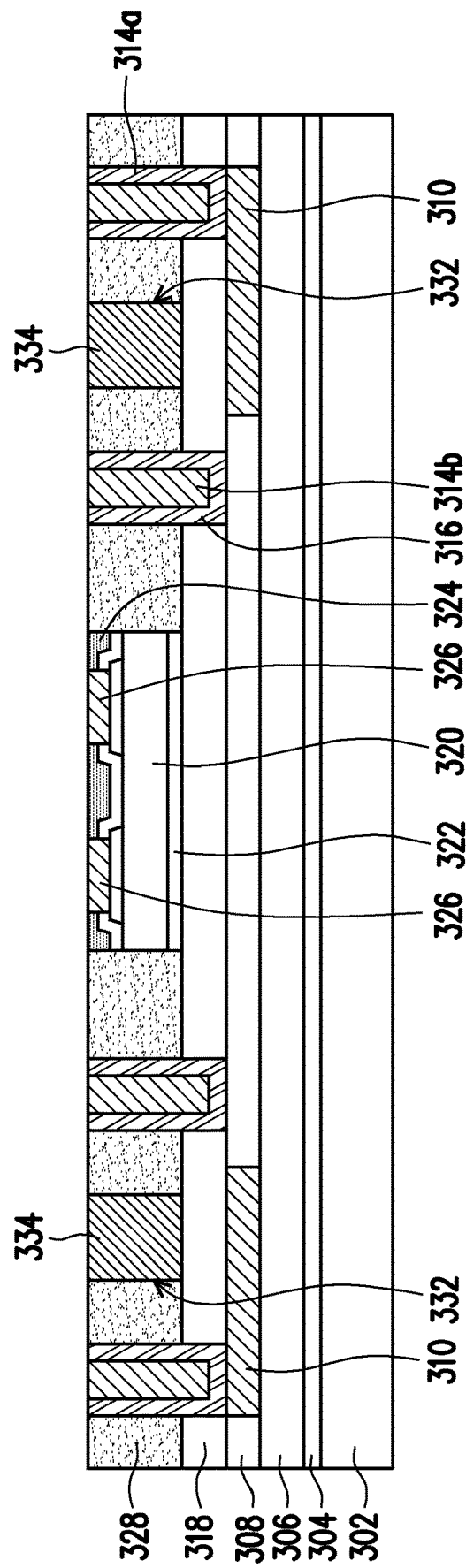
FIG. 3Q illustrates planarizing the structure of FIG. 3J, according to some embodiments.

Turning to FIG. 3P, a magnetic material 334 may be formed in the trench opening 332 and on the exposed outward facing surface (major surface) of the structure of FIG. 3O, according to some embodiments. As shown in FIG. 3Q, CMP may then be carried out to remove a portion of the magnetic material 334 on the upper surface of the molding material 328, i.e., remove the magnetic material 334 above and outside the trench opening 332, so as to expose upper surfaces of the electrically conducting vias 316 and pads 326 on the die 320, thereby leaving a core of magnetic material 334 disposed in the trench opening 332, according to some embodiments. As illustrated in FIG. 3Q, the planarization may result in the upper surfaces of the vias 316, pads 326, and magnetic structure (magnetic core) 334 in trench 332 being aligned at the same height in the layer structure.

In some embodiments, the magnetic material 334 may comprise a ferrite material. In some embodiments, the magnetic material 334 may comprise a mixture of about 40% Ni, about 40% Zn, and about 20% $CuFe_2O_4$ in atomic percent, which may be formed, e.g., by spin-coating. In some embodiments, the magnetic material 334 may comprise a mixture of about 80% Y and about 20% $BiFe_5O_{12}$ in atomic percent, which may be formed, e.g., by spin-coating. In some embodiments, the magnetic material 334 may comprise an alloy of about 80% Ni and about 20% Fe in atomic percent, which may be formed, e.g., by electroplating and/or by sputtering. In some embodiments, the magnetic material 334 may comprise an alloy of about 91.5% Co, about 4.5% Ta, and about 4% Zr in atomic percent, which may be formed by sputtering. In some embodiments, the magnetic material 334 may comprise at least one material selected form the group consisting of $CuFe_2O_4$, $BiFe_5O_{12}$, Ni—Fe alloy, and Co—Ta—Zr alloy. Magnetic materials such as described above may have low hysteresis and high permeability so as to provide high performance for the 3D inductor described herein. Of course, these materials and compositions for the magnetic structure 334 are merely exemplary, and other materials and compositions may be used for the magnetic structure 334.

Figure 3R:
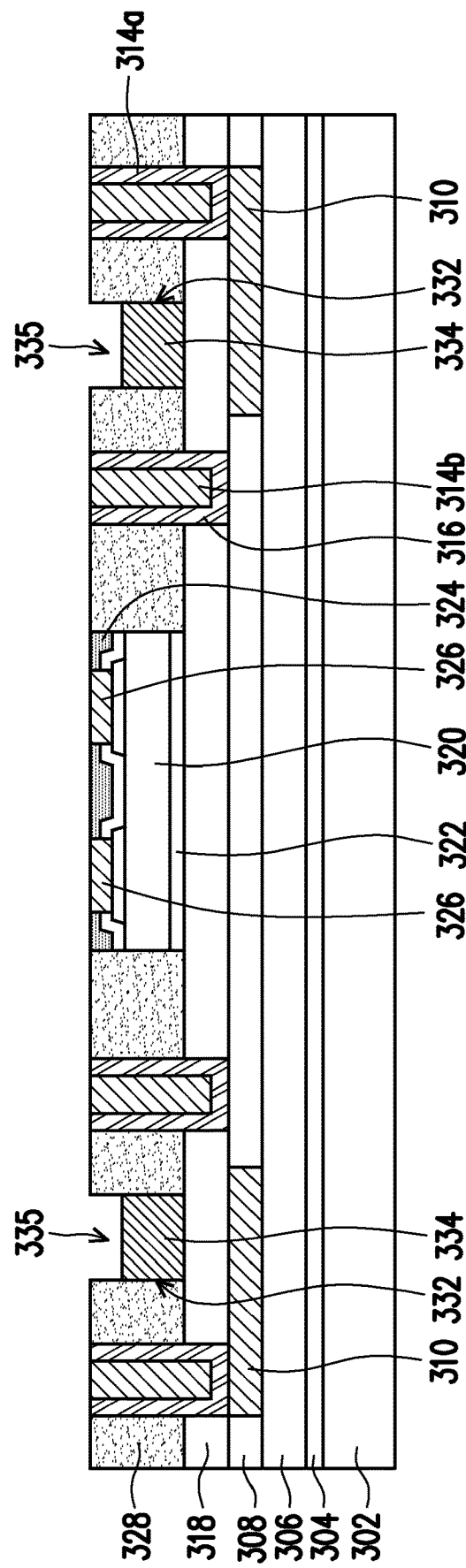
FIG. 3R illustrates removing a portion of the magnetic material in the trench of the structure of FIG. 3Q, according to some embodiments.

Turning to FIG. 3R, an upper portion of the magnetic material 334 in the trench opening 332 of the structure of FIG. 3Q may then be removed by selective etching according to some embodiments. For example, an upper portion of the magnetic material 334 in the trench opening 332 of the structure of FIG. 3Q may be selectively removed by using a selective chemical etch that etches the magnetic material 334 but which does not appreciably etch other materials of the structure. Choice of wet chemical etching mixtures may be chosen by one of skill in the art, e.g., with reference to catalogued listings of etchants for different materials (such as, e.g., "Standard Practice for Microetching Metals and Alloys," ASTM E407-07(2015), ASTM International) depending upon the magnetic material being etched and the types of other materials of the structure that will be exposed to the etch. For instance, suitable mixtures of nitric acid, acetic acid, hydrochloric acid, phosphoric acid and water may be used in some embodiments. Alternatively, in some embodiments, an upper portion of the magnetic material 334 in the trench opening 332 of the structure of FIG. 3Q may be selectively removed through a process of depositing a photoresist on the outward facing exposed surface (major surface) of the structure shown in FIG. 3Q, lithographically patterning the photoresist to expose an opening(s) therein aligned with the magnetic material 334 in the trench opening 332, and etching an upper portion of the magnetic material 334 in the trench opening 332 with directional etching such as RIE, using the patterned photoresist as an etch mask, to a desired depth, e.g., about 10 μm, leaving a depression(s) or recess(es) 335.

Figure 3S:
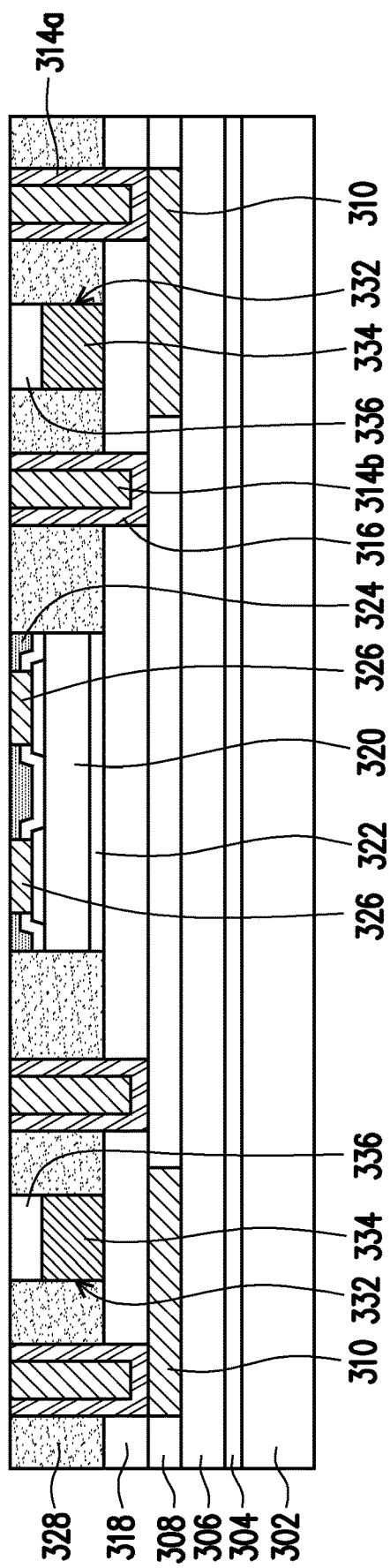
FIG. 3S illustrates forming an electrically insulating layer on exposed portions of the magnetic material in the trench of the structure of FIG. 3R, according to some embodiments.

Turning to FIG. 3S, an electrically insulating layer 336 may be selectively formed in the depression(s) 335 on exposed portions of the magnetic material 334 in the trench opening(s) 332 of the structure of FIG. 3R, according to some embodiments. For example, in some embodiments, an electrically insulating material 336 may be deposited on the outward facing exposed surface (major surface) of the structure illustrated in FIG. 3R, thereby filling the depressions 335 over the magnetic material 334 in the trench openings 332 as well as being formed elsewhere on the upper surface of the structure. CMP may then be carried out to remove electrically insulating material at the upper surface of the structure except in the regions of the depressions 335 over the magnetic material 334 in the trench openings 332.

Accordingly, the foregoing exemplary process steps illustrated in FIGS. 3J-3S represent an exemplary implementation of a step 208 of FIG. 2 of forming a layer of molding material around the die (e.g., die 320) and vias (e.g., vias 316), and forming a magnetic structure (e.g., magnetic core 334) within the layer of molding material (e.g., molding material 328).

Returning to FIG. 2, the exemplary method 200 also comprises at step 210 forming second conducting trace portions of the conductive trace above the layer of molding material and magnetic structure, the conductive trace and the magnetic structure forming an inductor. An exemplary implementation of this step will be described with regard to FIGS. 3T-3V.

Figure 3T:
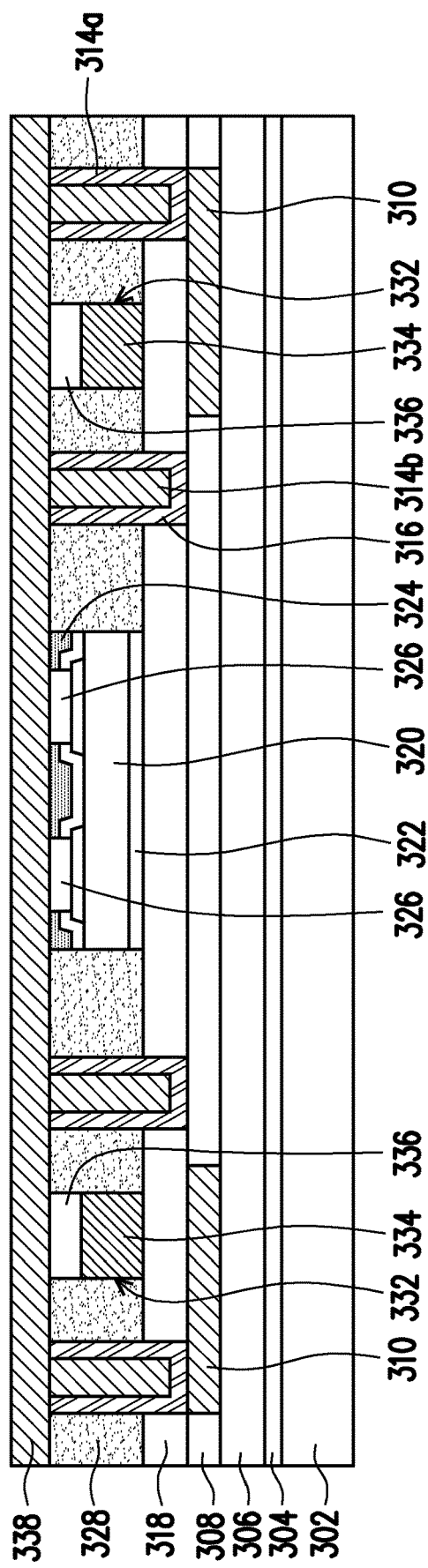
FIG. 3T illustrates depositing a metal layer on the structure of FIG. 3S, according to some embodiments.

Turning to FIG. 3T, a metal layer 338 can be formed on the outward facing surface (major surface) of the structure of FIG. 3S. For example, the metal layer 338 can be formed by depositing a thin metal seeding layer by physical vapor deposition, followed by deposition of a thicker metal layer by electroplating or electroless plating according some embodiments. The metal seeding layer can be, for example, a metal bilayer, such as a layer of copper on a layer of titanium, each of which may be deposited by physical vapor deposition such as sputtering or evaporation. Any suitable thicknesses for the layer(s) of the seeding layer may be used. For instance, the metal seeding layer may be formed by depositing about 500 angstroms of titanium followed by about 3000 angstroms of copper on the structure of FIG. 3S, or by depositing about 1000 angstroms of titanium followed by about 5000 angstroms of copper on the structure of FIG. 3S, according to some embodiments. Additional metal may then be formed on the metal seeding layer by electroplating or electroless plating, according to some embodiments. For instance, a layer of copper having a thickness in the range of about 5 µm to about 10 µm, e.g., 7 µm in some embodiments, may be deposited by electroplating, thereby yielding metal layer 338.

As shown in FIG. 3T, metal layer 338 is electrically connected to vias 316 as well as contact pads 326 on die 320. Metal layer 338 may be considered a precursor of a redistribution layer (RDL) of the package structure and may be labeled RDL-1 as a first-level RDL given its placement in the structure.

Figure 3U:
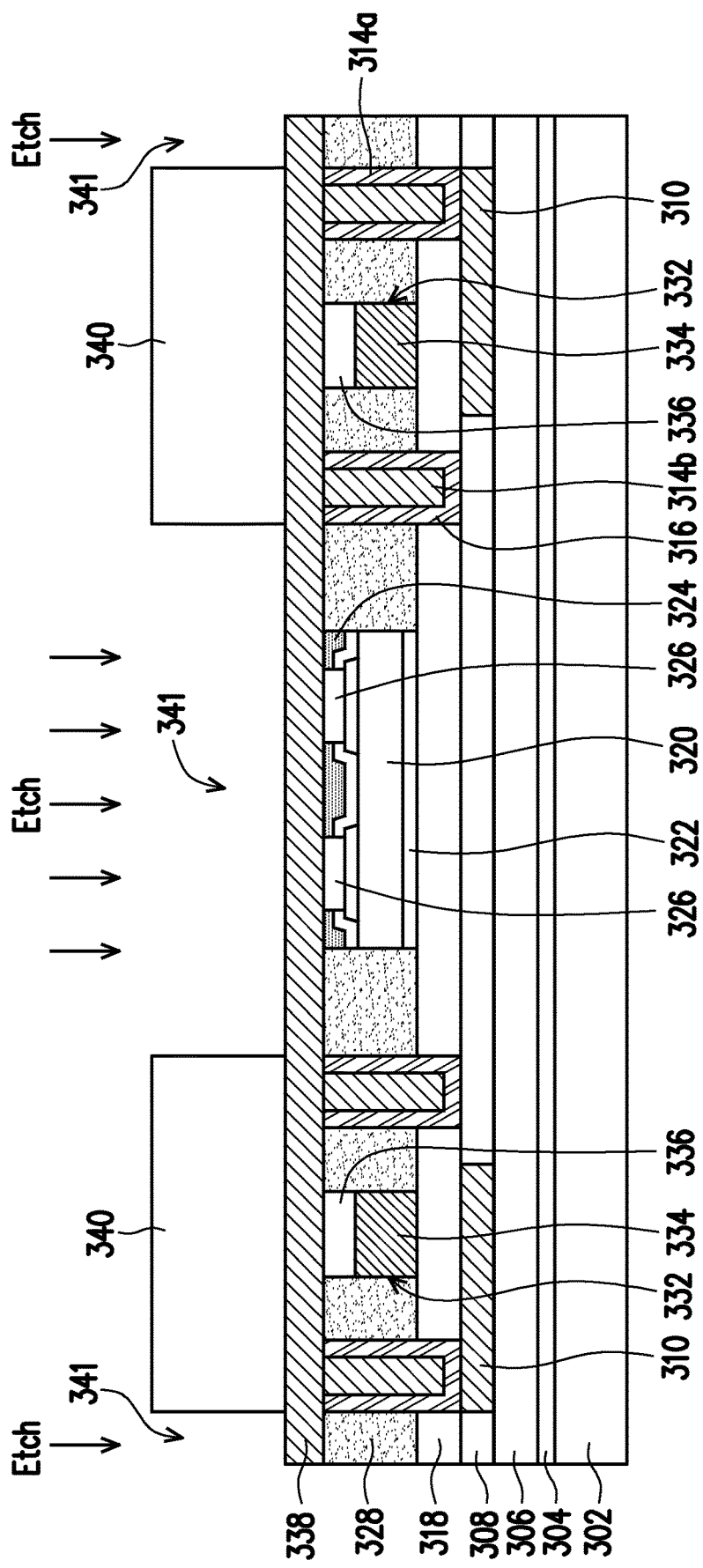
FIG. 3U illustrates depositing and patterning a sacrificial layer on the structure of FIG. 3T, and etching the exposed metal layer, according to some embodiments.

Turning to FIG. 3U, another patterned mask layer 340 can be formed on the outward facing surface (major surface) of the structure of FIG. 3T to serve as an etch mask for patterning the underlying metal layer 338. For example, a photoresist material may be deposited, e.g., by spinning, onto the outward facing surface of the structure of FIG. 3T and then patterned by conventional lithography to form an opening(s) 341 therein, thereby forming the patterned mask layer 340 in some embodiments. Layer 340 may also be patterned by laser drilling in some embodiments. The patterned mask layer 340 provides masking regions to protect portions of metal layer 338 that will form upper trace portions electrically connected to vias so as to form the 3D inductor. Opening(s) 341 may be positioned to permit other portions of the metal layer 338 to be etched away. As shown by the arrows at the upper portion of FIG. 3U, etching may be carried out to remove portions of the metal layer 338 in regions corresponding to openings 341 in the pattern mask layer 340.

The etching of exposed portions of metal layer 338 of FIG. 3U may be done, for example, by wet etching, plasma etching, RIE, etc. For example, a wet etching solution of HF (hydrofluoric acid)+AMAR (ammonia adsorption reagent, e.g., $Cu+NH_3$ compound) or a wet etching solution of HF+LDPP (liquid dipentyl phthalate, which contains TMAH or tetramethylammonium hydroxide) may be used to etch and remove desired portions of copper metal layer 338. The pattern mask 340, e.g., a patterned photoresist layer, shown in FIG. 3U may then be removed by etching. For example, the pattern mask 340 may be removed using plasma etching or RIE, or using stripping solutions tailored for particular photoresists optionally followed by a plasma etch, e.g., in an oxygen plasma, to remove any photoresist residue, such as known in the art. For example, in some embodiments, a wet removal of a photoresist pattern mask 340 may be done by using a solution of DMSO (dimethyl sulfoxide) to promote dissolution and swelling of the photoresist, followed by rinsing in water, followed by rinsing in TMAH (tetramethylammonium hydroxide), which can cut the polymer crosslinkage of the photoresist.

Figure 3V:
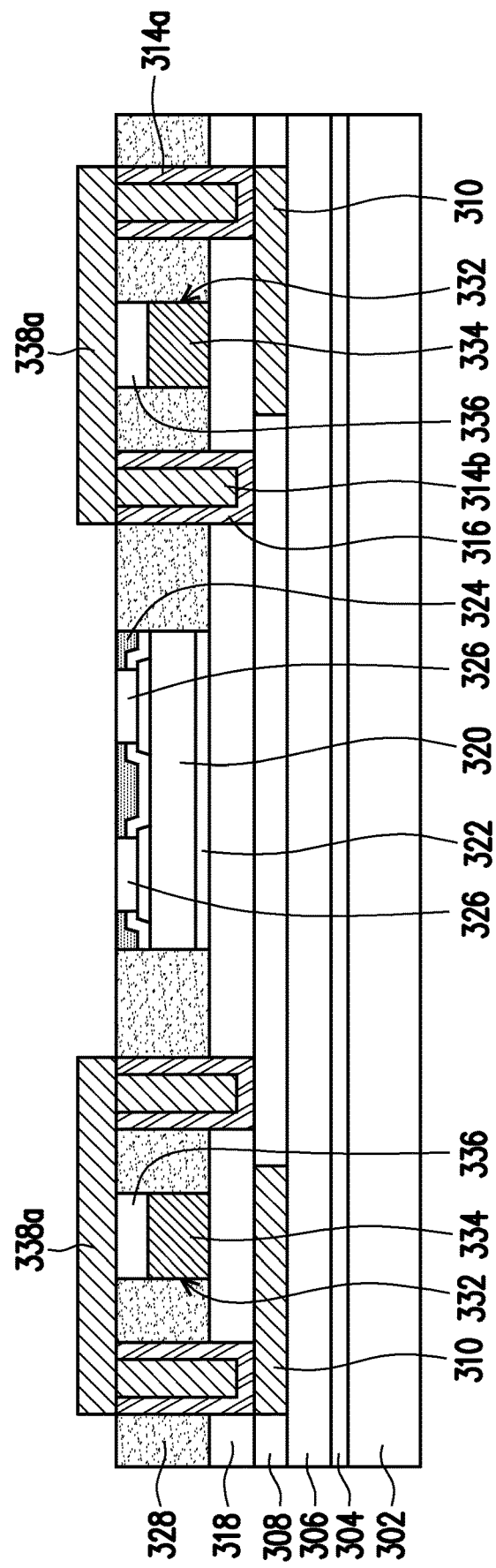
FIG. 3V illustrates removing the sacrificial layer of the structure shown in FIG. 3U, leaving the patterned metal layer, according to some embodiments.

Following the etching of exposed portions of metal layer 338 and removal of the pattern mask, such as described above, for example, a structure as illustrated in FIG. 3V may be obtained. As shown in FIG. 3V, in some embodiments, etching of the metal layer 338 and removal of the pattern mask 340, such as described above, can provide upper trace portions 338a that are electrically connected to vias 316, which are electrically connected to lower trace portions 310, so as to yield a 3D inductor comprising a conductive trace formed by lower trace portions, vias 316, and upper trace portions 338a electrically connected to one another in a coil shape around the magnetic structure (core) 334. A different exemplary view illustrating electrical connections of vias to upper and lower metal trace portions are shown in example of FIGS. 1A-1C discussed previously, in which metal vias 108c may be readily observed (e.g., FIG. 1C) to be electrically connected to lower-side metal trace portions 108b (shown in dashed lines in FIG. 1C) as well as upper-side metal trace portions 108a.

Accordingly, the foregoing exemplary process steps illustrated in FIGS. 3T-3V represent an exemplary implementation of a step 2010 of FIG. 2 of forming second conducting trace portions (e.g., upper trace portions 308a) of the conductive trace above the layer of molding material (e.g., molding material 328) and magnetic structure (e.g., magnetic core 334), the conductive trace and the magnetic structure forming an inductor.

Figure 3W:
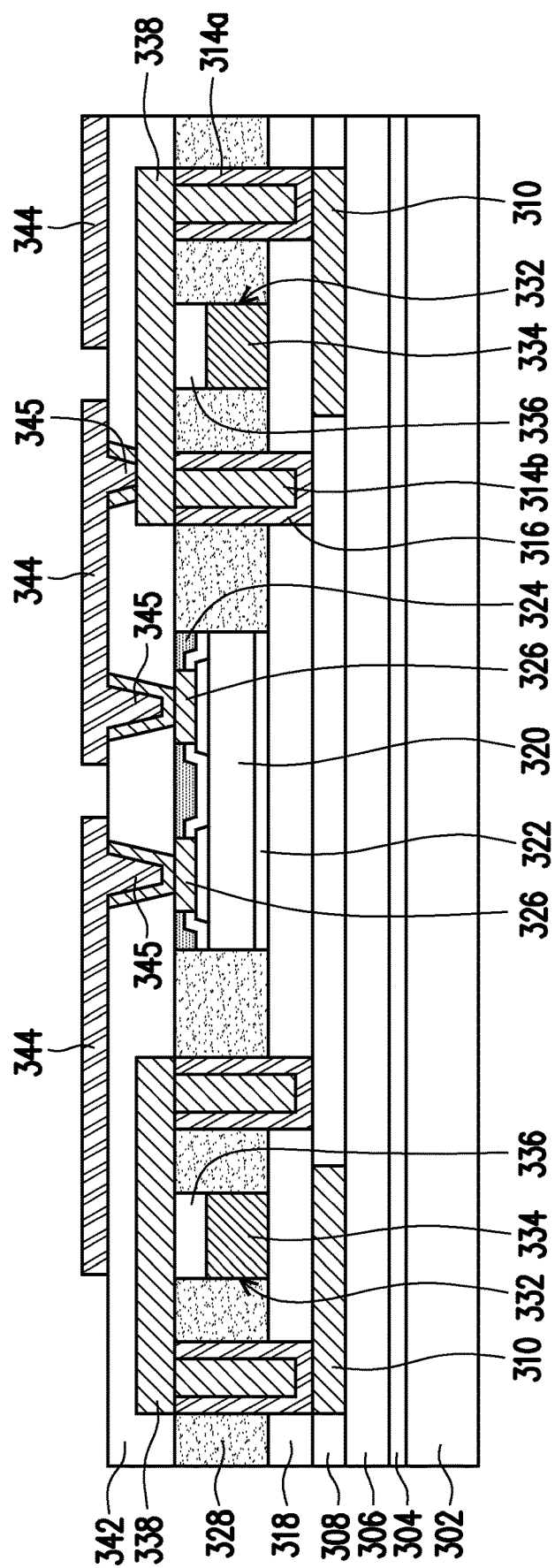
FIG. 3W illustrates forming an electrically insulating layer on the exposed surface of the structure of FIG. 3V, patterning the insulating layer to form via holes to electrical contacts on the die, and forming a patterned second RDL and electrically conducting vias electrically connected to contact pads on the die, according to some embodiments.

Additional exemplary processing will now be described for providing additional metallization for additional interconnect layers, e.g., second and third redistribution layers, and solder bumps to provide for input/output (I/O) to die circuitry and electrical I/O to the 3D inductor, with reference to FIGS. 3W-3Z. Turning to FIG. 3W, a second-level, patterned conductor RDL-2 344 may be formed over a patterned electrically insulating (dielectric) layer 342, the patterned insulating layer 342 having openings in which vias 345 may be formed that provide electrical connection to metal pads 326. According to some embodiments, the insulating layer 342 may have a thickness in the vertical direction that is between about 2 µm to about 50 µm. According to some embodiments, the insulating layer 342 may have a thickness in the vertical direction that is between about 5 µm to about 10 µm, e.g., such as about 5 µm, 7 µm, 10 µm, etc. The dielectric insulating layer 342 may be patterned using conventional photolithography and etching such as known in the art and as described elsewhere herein.

The second-level conductor RDL-2 344 may be formed by depositing a layer of conductor metal (e.g. copper) by plating on the patterned dielectric insulating layer 342, which may be done by electroplating or electroless plating, for example. To facilitate the electroplating, a thin seed layer of Ti/Cu (e.g., 1000/5000 angstroms thick) (not shown) may be first deposited on the top surface of the patterned insulating layer 342. The layer of conductor metal may then be patterned and etched using conventional patterning and metallization processing such as known in the art and as described elsewhere herein, including damascene processing using CMP, leaving behind second level conductor RDL-2 344 structures over the vias 345 (which may be referred to as though insulator vias or TIVs). The second-level conductor RDL-2 344 may have any suitable thickness such as about 5 µm to about 10 µm, e.g., such as about 5 µm, 7 µm, 10 µm, etc. An exemplary resulting structure is shown in FIG. 3W.

Figure 3X:
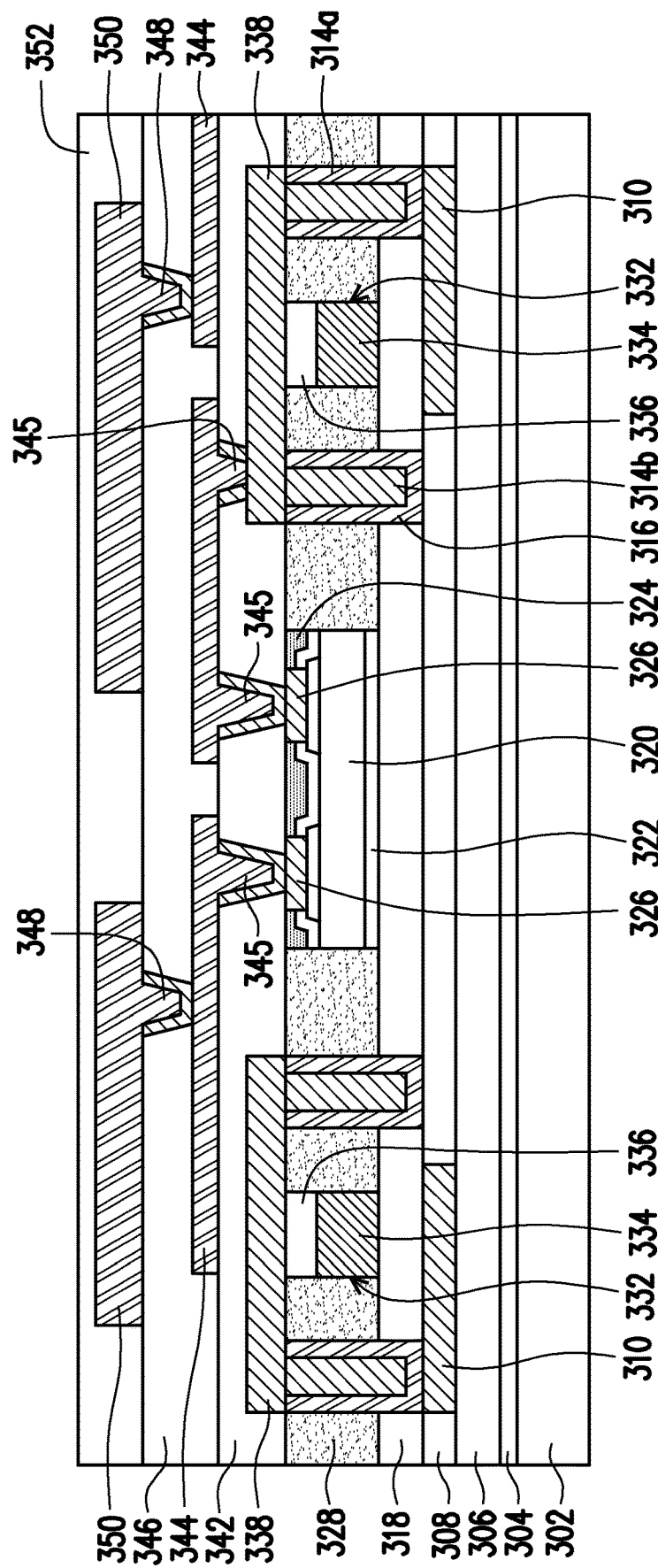
FIG. 3X illustrates forming an electrically insulating layer on the exposed surface of the structure of FIG. 3W, patterning the insulating layer to form via holes to the underlying second RDL, and forming a patterned third RDL and electrically conducting vias electrically connected to the second RDL, according to some embodiments.

Turning to FIG. 3X, forming the top-side redistribution wiring structure is continued by forming another patterned electrically insulating layer 346 over the second level conductor RDL-2 344 structures, the patterned insulating layer 346 having openings in which vias 348 may be formed that provide electrical connection to the second level conductor RDL-2 344 structures. According to some embodiments, the insulating layer 346 may have a thickness in the vertical direction that is between about 2 µm to about 50 µm. According to some embodiments, the insulating layer 346 may have a thickness in the vertical direction that is between about 5 µm to about 10 µm, e.g., such as about 5 µm, 7 µm, 10 µm, etc. The dielectric insulating layer 346 may be patterned using conventional photolithography and etching such as known in the art and as described elsewhere herein.

A third-level conductor RDL-3 350 may be formed by depositing a layer of conductor metal (e.g. copper) by plating on the patterned insulating layer 346, which may be done by electroplating or electroless plating, for example. To facilitate the electroplating, a thin seed layer of Ti/Cu (e.g., 1000/5000 angstroms thick) (not shown) may be first deposited on the top surface of the patterned insulating layer 346. The layer of conductor metal may then be patterned and etched using conventional patterning and metallization processing such as known in the art and as described elsewhere herein, including damascene processing using CMP, leaving behind third-level conductor RDL-3 350 structures over the vias 348 (e.g., referred to as TIVs). The third-level conductor RDL-3 350 may have any suitable thickness such as about 5 µm to about 10 µm, e.g., such as about 5 µm, 7 µm, 10 µm, etc.

An additional insulating layer 352 may then be formed over the third-level conductor RDL-3 350 structures and exposed areas of the insulating layer 346. According to some embodiments, the insulating layer 352 may have a thickness in the vertical direction that is between about 2 µm to about 50 µm. According to some embodiments, the insulating layer 352 may have a thickness in the vertical direction that is between about 5 µm to about 10 µm, e.g., such as about 5 µm, 7 µm, 10 µm, etc. An exemplary resulting structure is shown in FIG. 3X.

Figure 3Y:
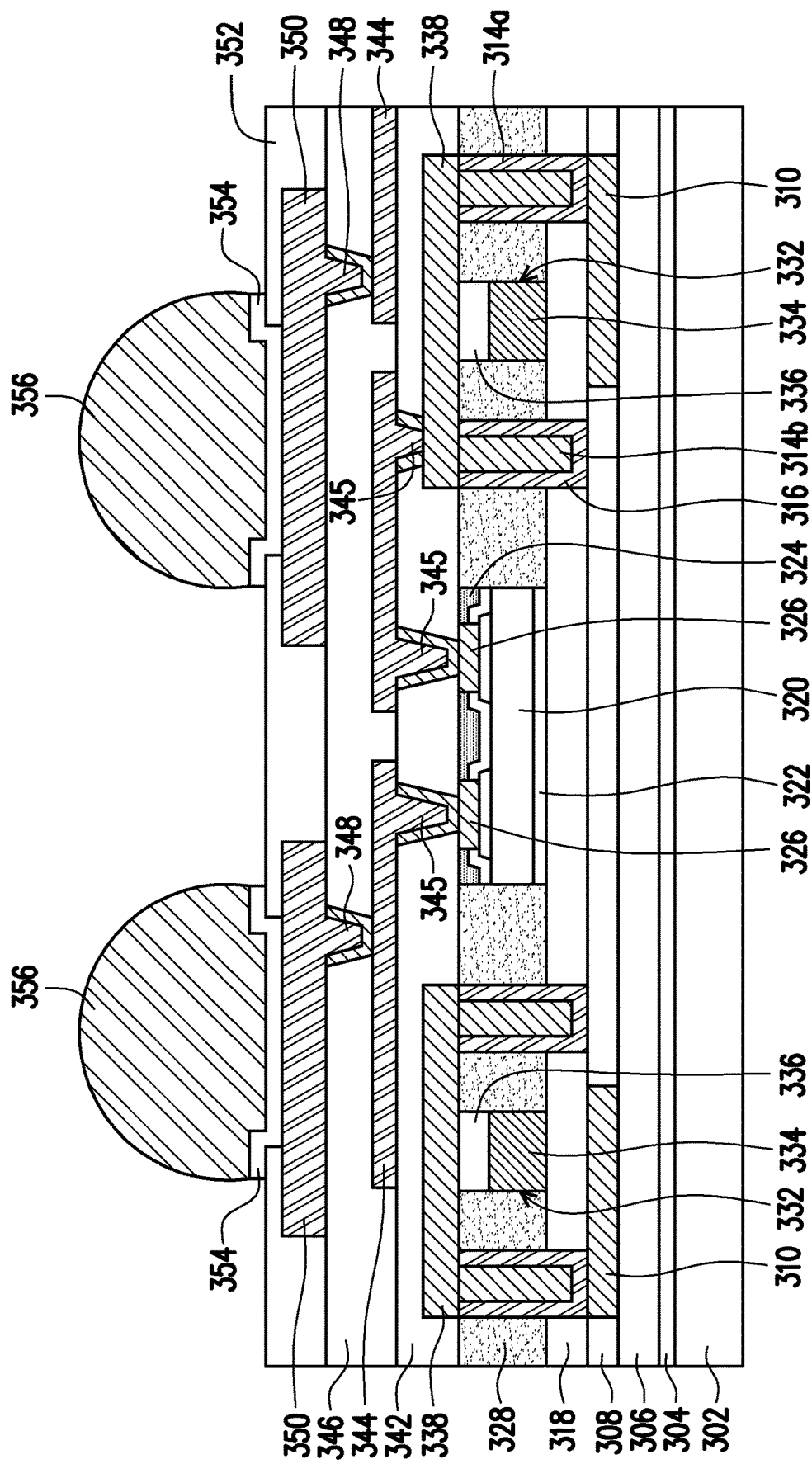
FIG. 3Y illustrates forming an electrically insulating layer on the exposed surface of the structure of FIG. 3X, patterning the insulating layer to form contact windows (openings) in the insulating layer to the underlying third RDL, forming under bump metal (UBM) portions electrically connected to the third RDL, and forming solder balls or solder bumps on the UBM portions, according to some embodiments.
Figure 3Z:
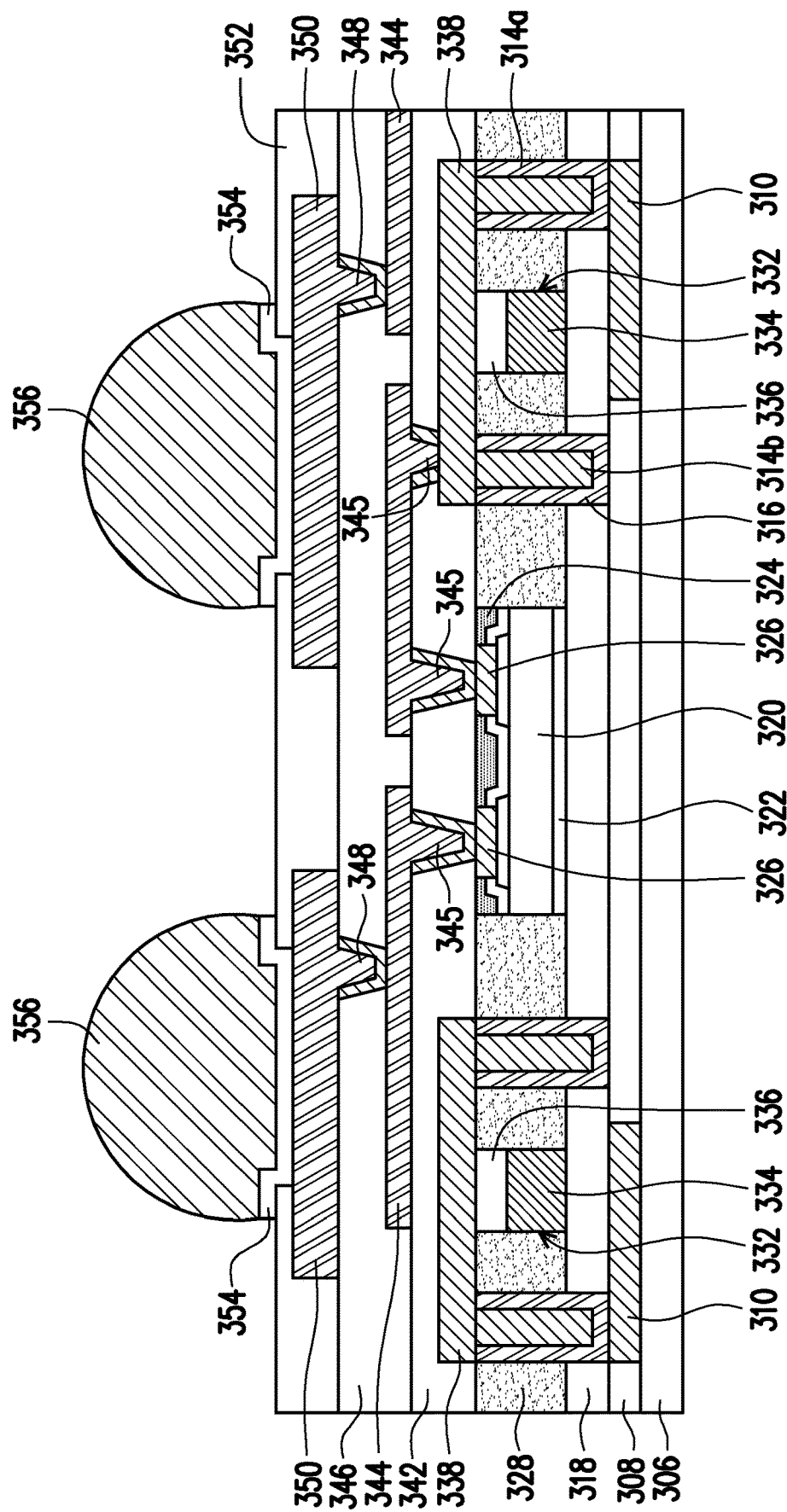
FIG. 3Z illustrates removing the LTHC layer to remove the glass carrier from the structure, according to some embodiments.

Turning to FIG. 3Y, forming the top-side redistribution wiring structure may be continued by patterning the insulating layer 352 and forming openings in which under ball metal (UBM) pads 354 are formed conductor metal (e.g. copper), using conventional patterning and metallization processing such as known the art and as described elsewhere herein, for example. As shown in FIG. 3Y, solder bumps 356 may then be attached to the exposed portions of the UBM pads 354. The solder bumps 356 can be formed by placing solder balls on the UBM pads 354 and then reflowing the solder balls. In some embodiments, the formation of the solder bumps 356 may include performing a plating step to form solder regions over the UBM pads 354, and then reflowing the solder regions. In some embodiments, the electrical interconnection structures 356 can be metal vias, or metal vias and solder caps, which may also be formed through plating, such as known in the art.

The RDL-1 338, RDL-2 344, vias 345, RDL-3 350, vias 348, and UBM pads 354 can comprise a metal or a metal alloy including aluminum, copper, tungsten, and/or alloys thereof, for example. In some embodiments, the insulating layers 342, 346, and 352 (as with other insulating layers described herein), may comprise a polymer material such as, e.g., polybenzoxazole (PBO), polyimide (PI), benzocyclobutene (BCB), or other polymer material that is electrically insulating. In some embodiments, the insulating layers 342, 346, and 352 may comprise glass, a spin-on glass (SOG), a ceramic, low temperature co-fired ceramic (LTCC), silicon oxide, silicon nitride, silicon carbide, silicon oxynitride, or the like. According to some embodiments, the insulating layers 342, 346, and 352 may be formed using a spin-on process, a deposition process, an injection process, a growth process, a sputtering process, etc. An exemplary resulting structure is shown in FIG. 3Y.

Next, the integrated package structure (e.g., InFO package structure) comprising the 3D inductor may be debonded from the carrier 302. For example, where the release layer 304 is a LTHC layer, suitable light illumination, e.g., UV light, UV laser irradiation, etc., may be applied from the back side (carrier side) of the structure to weaken the bonds of the LTHC material such that the carrier 302 may be separated from the remaining structure. Alternatively, where the release layer 304 is an adhesive layer, a suitable solvent may be used to dissolve the release layer 304. In any case, any remaining adhesive of the release layer 304 may be cleaned from the integrated package structure using a suitable solvent or cleaning chemical. In addition, insulating layer 306 may be retained in the resulting integrated package structure to provide protection at the bottom side of the package structure. An exemplary resulting structure is shown in FIG. 3Z.

It should be understood that the processing described above is exemplary, and that variations thereof may be carried out while still remaining within the scope of the claims and disclosure. For instance, whereas FIGS. 3I-3S illustrate an example where the magnetic structure 334 is formed within a trench in molding material 328 subsequent to depositing the molding material 328, in an alternative, magnetic structure 334 could be formed at the stage of FIG. 3H. In particular, the magnetic structure 334 could be formed at the stage of FIG. 3H by depositing a layer of patternable material, e.g., photoresist at on the outward facing surface of the structure illustrated in FIG. 3H, patterning the photoresist to form one or more trenches therein, forming the magnetic structure in the trench(es) in the photoresist by deposition or plating, planarizing the structure back to the level of the upper surfaces of vias 316 to remove excess magnetic material, and removing the photoresist. Then the die could similarly be placed in position as shown at FIG. 3I, and molding material could be applied to the outward facing surface of the structure as shown in FIG. 3J, except in this instance, the molding material 328 would be formed around the magnet structure 334 as well as the vias 316 and the die 302. Thus, for example, the magnetic structure 334 could be embedded in the molding material 328 during the same process step as when the vias 316 and or the die 302 are embedded in molding material 328. Other variations falling within the scope of the disclosure may also be made.

Figure 4:
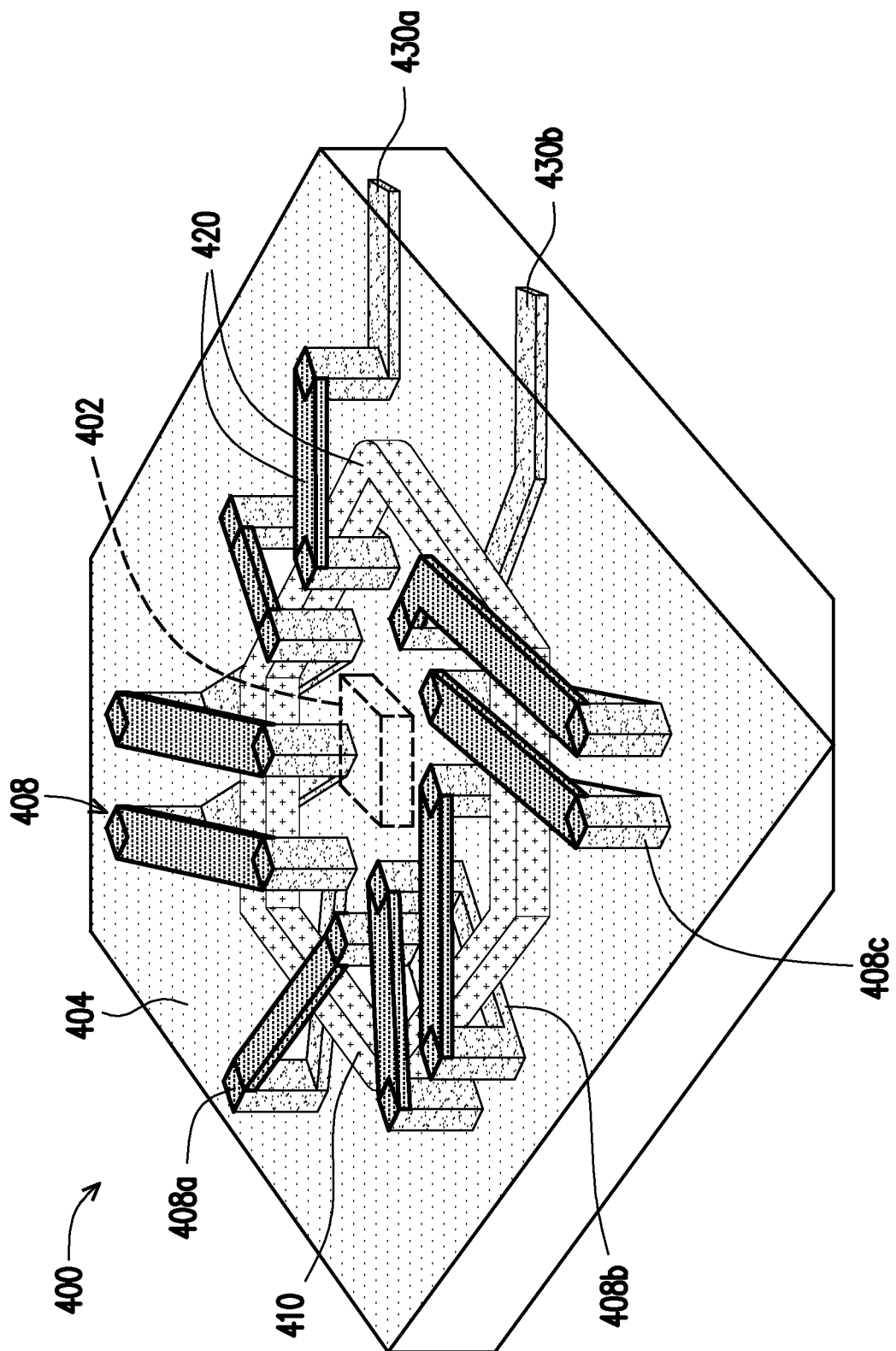
FIG. 4 illustrates a perspective view of a portion of an exemplary integrated circuit package structure including a die and inductor with magnetic core section, according to some embodiments.

FIG. 4 illustrates a perspective view of a portion of an exemplary integrated circuit package structure including a die and inductor with magnetic core portion, according to some embodiments, such as previously described herein. As shown in FIG. 4, a die 402 is disposed within a molding material 404 proximate to a 3D inductor structure 420, wherein the 3D inductor structure 420 comprises a conductive metal trace 408 and a magnetic structure 410, e.g., a magnetic core. The conductive trace 408 may comprise top metal trace portions 408*a*, bottom metal trace portions 408*b*, and vias 408*c* electrically connected together as illustrated in FIG. 4 so as to form an electrically conductive coil that surrounds the magnetic core 410, thereby forming a 3D inductor. Electrically conducting inductor connections (ports) 430*a* and 430*b* provide electrical I/O connection to the 3D inductor. The magnetic core 410 and the inductor coil formed by conductive trace 408 that surrounds the magnetic core may have any desired shape in plan view, e.g., circular loop, polygon ring, square ring, rectangular ring, hexagon ring, for instance. Such shapes may all be considered toroidal shapes for purposes of this disclosure. The density of coils per unit length may be selected as desired to provide to provide desired values of inductance.

Figure 5:
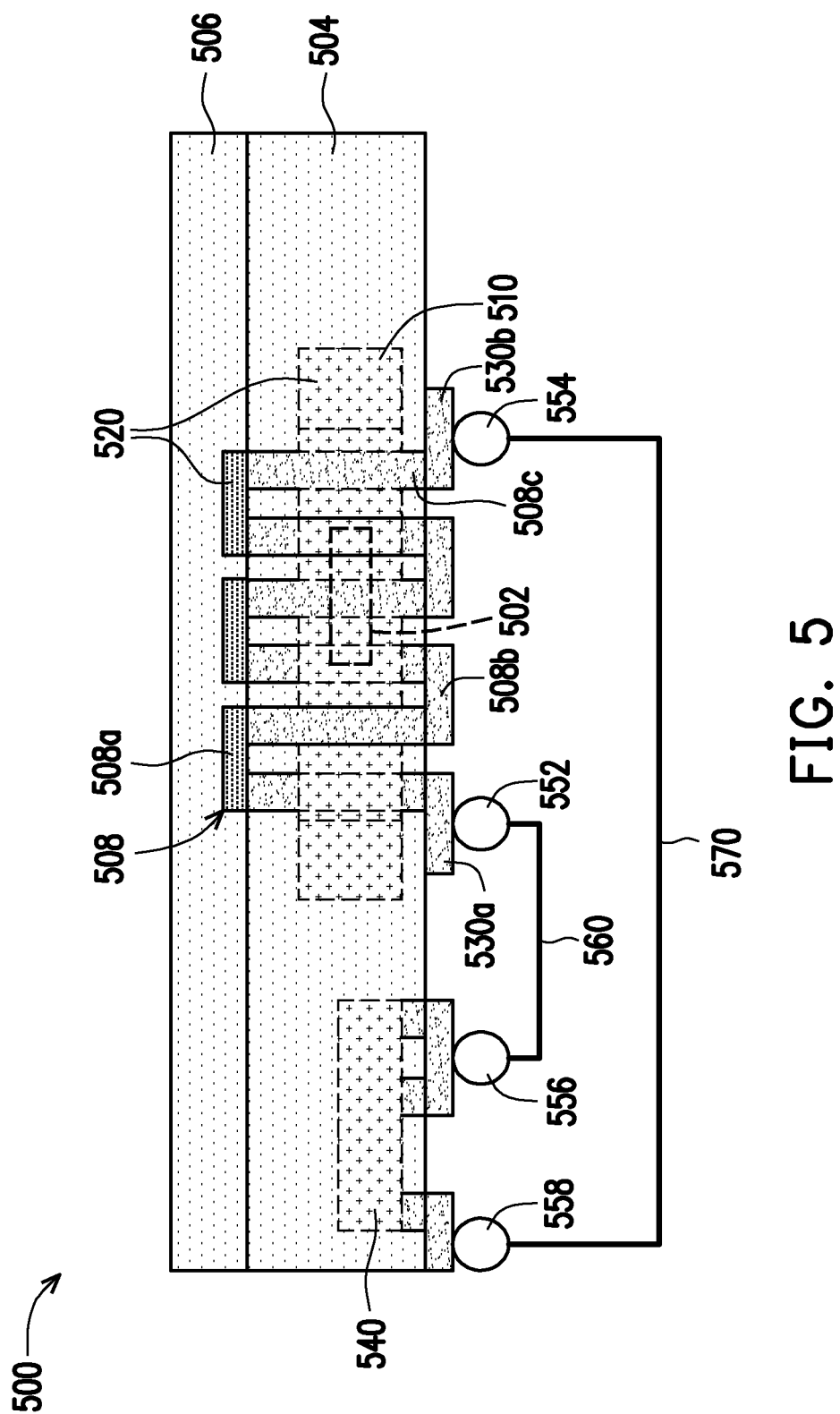
FIG. 5 illustrates a sectional view of an exemplary integrated electronic device package, according to some embodiments.

FIG. 5 illustrates a sectional side view of an exemplary integrated electronic device package, according to some embodiments. According to some embodiments, the integrated circuit package 500 comprises a die 502, an inductor 520, and an active device 540. The inductor may comprise an electrically conductive trace 508 proximate to a magnetic structure 510, e.g., a magnet core. The conductive trace 508 may comprise top metal trace portions 508a, bottom metal trace portions 508b, and vias 508c electrically connected together as illustrated in FIG. 5 so as to form an electrically conductive coil that surrounds the magnetic core 510, thereby forming a 3D inductor. Electrically conducting inductor connections (ports) 530a and 530b provide electrical I/O connection to the 3D inductor 520. In some embodiments, as illustrated in FIG. 5, the via trace portions 508c may be disposed within a layer of molding material 504, and the upper trace portion 508a may be disposed in an electrically insulating layer 506 disposed on the molding compound, e.g., wherein a bottom surface of the upper trace portion 508a is disposed at an interface between the layer of molding compound 504 and the insulating layer 506. The magnetic core 510 and the inductor coil formed by conductive trace 508 that surrounds the magnetic core 510 may have any desired shape in plan view, e.g., circular loop, polygon ring, square ring, rectangular ring, hexagon ring, for instance. The density of coils per unit length may be selected as desired to provide to provide desired values of inductance.

The inductor 520 may be connected to one or more active devices, such as integrated circuits, within the integrated circuit package 500. For instance the inductor 520 may connected to the die 502 via electrical connections (not shown) such as RDL layer(s) as illustrated in FIG. 3Z, for instance, and/or the inductor 520 may be connected to one or more other active devices such as active device 540, e.g., via one or more conductive mounts and connections such as electrical connection 555, which may be any suitable type of wiring or metallization, connected to conductive mounts such as solder bumps or solder balls, for instance. According to some embodiments, the active device 540 may comprise an integrated circuit, such as a power managed integrated circuit.

In some embodiments, the inductor 520 may be electrically connected to the active device 540 via one or more conductive mounts and connections. In some embodiments, a first conductive mount 552 is electrically connected to a first inductor port 530 of the inductor (e.g., a first end 530a of the conductive trace 508), and a second conductive mount 555 is electrically connected to a second inductor port 530b of the inductor 520 (e.g., a second end 530b of the conductive trace 1508). In some embodiments, a third conductive mount 556 is electrically connected to the active device 540 at a first position, and a fourth conductive mount 558 is electrically connected to the active device 540 at a second position. According to some embodiments, a first electrical connection 560 electrically connects the first conductive mount 552 and the third conductive mount 556, and a second connection 570 electrically connects the second conductive mount 554 and the fourth conductive mount 558. In some embodiments, the inductor 520 provides various types of functionality for the active device 540 through at least one of the first connection 560 or the second connection 570.

In some embodiments, the inductor 520 may function as a transformer configured to step up or step down voltage to the active device 540. In some embodiments, the inductor 520 may function as an inductor of a wireless charger, a transformer, an antenna, a radio frequency (RF) circuit element (e.g., for impedance matching), and the like. In particular, the inductor 520 may function as a near-field coil in a portable wireless device, e.g., a wireless phone or tablet, for implementing wireless charging for the portable wireless device. The same near-field coil may be coupled with a wireless charging power amplifier integrated into the same portable wireless device and multiplexed to configure the wireless portable device as a wireless power transmitter for charging other nearby portable devices, such as Internet-of-Things devices that have wireless charging receiver coils built in.

As described herein, an inductor having a magnetic structure (e.g., magnetic core) may be formed within an integrated fan-out (InFO) package in such a way that the inductor may have a desired size including a miniaturized size to accommodate miniaturization of features in device packages. The integrated fabrication of the inductor may promote efficiency, simplicity and cost savings in fabrication. The magnetic structure (e.g., core) may be formed using any of a variety of high permeability magnetic materials such as described herein, thereby providing high inductance of the inductor, which may increase performance and efficiency of the inductor. The magnetic structure (e.g., core) may be formed of magnetic materials with ULSI compatible processes, e.g., spin-coating, electroplating deposition, electroless plating, sputtering, etc., thereby permitting inductors to be integrated into device packages in a way consistent with existing device packaging. Also, integrated circuit devices, e.g., application processor devices or other active devices, may be directly integrated into the InFO package in regions inside and/or outside the inductor without incompatibilities in the manufacturing process.

According to some embodiments, an integrated electronic device package may include: a semiconductor die comprising an integrated circuit disposed at a first layer of a package structure, the package structure comprising multiple layers, the first layer comprising a molding material; an inductor comprising an electrically conducting trace and a magnetic structure, the electrically conducting trace being disposed around the magnetic structure, the electrically conducting trace comprising trace portions at second and third layers of the package structure, the electrically conducting trace comprising first vias extending between the second and third layers, the first vias interconnecting the trace portions to form a coil structure, the first vias being embedded in the molding material of the first layer along with the die, the magnetic structure being disposed within the coil structure of the inductor; and multiple electrically conducting interconnects disposed at one or more layers of the package structure, the multiple electrically conducting interconnects being connected to the die with second vias, the multiple electrically conducting interconnects providing signal routing for the die, the die being disposed between portions of the inductor.

According to some embodiments, a method of fabricating an integrated electronic device package including an inductor may include: forming first trace portions of an electrically conductive trace on an electrically insulating layer of a package structure, the first trace portions being electrically conductive; forming vias of the electrically conductive trace in a sacrificial layer disposed on the electrically insulating layer, the vias being electrically conductive; removing the sacrificial layer and placing a die above the electrically insulating layer; forming a layer of molding material around exposed surfaces of the die and exposed surfaces of the vias, and forming a magnetic structure within the layer of molding material; and forming second trace portions of the conductive trace above the layer of molding material and the magnetic structure, the second trace portions being electrically conductive, the conductive trace and the magnetic structure forming an inductor.

According to some embodiments, a method of fabricating an integrated electronic device package including an inductor may include: forming first trace portions on a first electrically insulating layer of a package structure, the first trace portions being electrically conductive; forming vias in a sacrificial layer disposed on the first electrically insulating layer, the vias being electrically conductive and being electrically connected to respective first trace portions; removing the sacrificial layer, and forming a second electrically insulating layer on the first insulating layer; placing a die on the second electrically insulating layer; forming a molding material over and around exposed surfaces of the die and exposed surfaces of the vias; planarizing the molding material and forming a trench therein; forming a magnetic material in the trench and forming electrically insulating material over the magnetic material in the trench, so that the magnetic material in the trench is electrically insulated; and forming second trace portions above the molding material and the magnetic material, the second trace portions being electrically conductive and being electrically connected to the vias, such that the first trace portions, the vias, and the second trace portions form an inductor spanning multiple layers of the package structure, with coils of the inductor surrounding the magnetic material in the trench, at least some of the vias of the inductor being embedded in the molding material of the first layer along with the die.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, etc., depicted herein are illustrated with particular dimensions relative to one another, such as structural dimensions or orientations for purposes of simplicity and ease of understanding and that actual dimensions of the same differ substantially from that illustrated herein, in some embodiments. Additionally, a variety of techniques exist for forming the layers features, elements, etc., mentioned herein, such as electrochemical plating (ECP), etching techniques, wet remove techniques, implanting techniques, doping techniques, spin-on techniques, sputtering techniques such as magnetron or ion beam sputtering, growth techniques, such as thermal growth, or deposition techniques such as chemical vapor deposition (CVD), atomic layer deposition (ALD), physical vapor deposition (PVD), etc.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. An integrated electronic package, comprising:
a package structure comprising multiple layers;
a first layer of the package structure comprising a molding material;
an inductor comprising an electrically conducting trace and a magnetic structure, the electrically conducting trace being disposed around the magnetic structure, the electrically conducting trace comprising trace portions at second and third layers of the package structure, the second and third layers being respectively below and above the molding material, the electrically conducting trace comprising first vias extending between the second and third layers, the first vias electrically interconnecting the trace portions to form a coil structure, the first vias of the inductor being embedded in the molding material of the first layer along with a die, the die being disposed between portions of and lying in a same plane as the inductor, the magnetic structure being disposed within the coil structure of the inductor; and
multiple electrically conducting interconnects disposed at one or more layers of the package structure, the multiple electrically conducting interconnects being connected to the die with second vias.

2. The integrated electronic package of claim 1, the die comprising an integrated circuit disposed at the first layer of the package structure, the inductor being configured in a toroidal shape.

3. The integrated electronic package of claim 1, the magnetic structure being configured in a closed loop shape.

4. The integrated electronic package of claim 1, wherein the magnetic structure comprises at least one material selected form the group consisting of $CuFe_2O_4$, $BiFe_5O_{12}$, Ni—Fe alloy, and Co—Ta—Zr alloy.

5. The integrated electronic package of claim 1, wherein the magnetic structure comprises in atomic percentage about 40% Ni, about 40% Zn, and about 20% $CuFe_2O_4$.

6. The integrated electronic package of claim 1, wherein the magnetic structure comprises in atomic percentage about 80% Y and about 20% $BiFe_5O_{12}$.

7. The integrated electronic package of claim 1, wherein the magnetic structure comprises an alloy in atomic percentage of about 80% Ni and about 20% Fe.

8. The integrated electronic package of claim 1, wherein the magnetic structure comprises an alloy in atomic percentage of about 91.5% Co, about 4.5% Ta, and about 4% Zr.

9. The integrated electronic package of claim 1, wherein the inductor has a polygonal shape.

10. The integrated electronic package of claim 1, wherein at least one of the second and third layers includes a material different from the molding material.

11. An integrated electronic package, comprising:
a semiconductor die comprising an integrated circuit disposed at a first layer of a package structure, the package structure comprising multiple layers, the first layer comprising a molding material;

an inductor comprising an electrically conducting trace and a magnetic structure, the die lying in a same plane as the inductor, the electrically conducting trace being disposed around the magnetic structure, the electrically conducting trace comprising trace portions at second and third layers, the second and third layers being respectively below and above the molding material, the electrically conducting trace comprising first vias extending between the second and third layers, the first vias electrically interconnecting the trace portions to form a coil structure, the first vias of the inductor being embedded in the molding material of the first layer along with the die, the magnetic structure being disposed within the coil structure of the inductor; and multiple electrically conducting interconnects disposed at one or more layers of the package structure, the multiple electrically conducting interconnects being connected to the die with second vias, the die being disposed between portions of the inductor.

12. The integrated electronic package of claim 11, the inductor being configured in a toroidal shape.

13. The integrated electronic package of claim 11, the magnetic structure being configured in a closed loop shape.

14. The integrated electronic package of claim 11, wherein the magnetic structure comprises at least one material selected form the group consisting of $CuFe_2O_4$, $BiFe_5O_{12}$, Ni—Fe alloy, and Co—Ta—Zr alloy.

15. The integrated electronic package of claim 11, wherein the magnetic structure comprises in atomic percentage about 40% Ni, about 40% Zn, and about 20% $CuFe_2O_4$.

16. The integrated electronic package of claim 11, wherein the magnetic structure comprises in atomic percentage about 80% Y and about 20% $BiFe_5O_{12}$.

17. The integrated electronic package of claim 11, wherein the magnetic structure comprises an alloy in atomic percentage of about 80% Ni and about 20% Fe.

18. The integrated electronic package of claim 11, wherein the magnetic structure comprises an alloy in atomic percentage of about 91.5% Co, about 4.5% Ta, and about 4% Zr.

19. An integrated electronic package, comprising:

an inductor comprising an electrically conducting trace and a magnetic structure, the electrically conducting trace being disposed around the magnetic structure, the electrically conducting trace comprising trace portions at second and third layers of a package structure, the second and third layers being respectively below and above a molding material at a first layer of the package structure, the electrically conducting trace comprising first vias extending between the second and third layers, the first vias electrically interconnecting the trace portions to form a coil structure, the first vias of the inductor being embedded in the molding material of the first layer along with a die, the die being disposed between portions of and lying in a same plane as the inductor, the magnetic structure being disposed within the coil structure of the inductor; and multiple electrically conducting interconnects disposed at one or more layers of the package structure, the multiple electrically conducting interconnects being connected to the die with second vias.

20. The integrated electronic package of claim 19, the die comprising an integrated circuit disposed at the first layer, the package structure comprising multiple layers.

* * * * *